US010117342B2

(12) United States Patent
An et al.

(10) Patent No.: US 10,117,342 B2
(45) Date of Patent: Oct. 30, 2018

(54) DISPLAY APPARATUS INCLUDING A HOUSING HAVING A PILLAR SHAPE, A PLURALITY OF ATTACHED MONITORS, AND A CENTRAL DRIVING UNIT

(71) Applicant: Samsung Display Co., Ltd., Yongin-Si, Gyeonggi-Do (KR)

(72) Inventors: Junghyun An, Asan-si (KR); Jongmin Shim, Hwaseong-si (KR); Min-soo Choi, Hwaseong-si (KR); Junpyo Lee, Asan-si (KR); Seunghwan Moon, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/642,676

(22) Filed: Jul. 6, 2017

(65) Prior Publication Data
US 2018/0014416 A1 Jan. 11, 2018

(30) Foreign Application Priority Data
Jul. 7, 2016 (KR) ........................ 10-2016-0086302

(51) Int. Cl.
| | |
|---|---|
| *H05K 5/00* | (2006.01) |
| *H05K 5/03* | (2006.01) |
| *H05K 7/14* | (2006.01) |
| *H05K 5/02* | (2006.01) |
| *G09F 19/00* | (2006.01) |
| *G06F 1/16* | (2006.01) |
| *G06F 3/14* | (2006.01) |
| *A47F 5/04* | (2006.01) |
| *G09G 3/20* | (2006.01) |

(52) U.S. Cl.
CPC .......... *H05K 5/0017* (2013.01); *A47F 5/04* (2013.01); *G06F 1/16* (2013.01); *G06F 3/1423* (2013.01); *G09F 19/00* (2013.01); *H05K 5/0217* (2013.01); *H05K 5/0226* (2013.01); *H05K 5/0247* (2013.01); *H05K 5/03* (2013.01); *H05K 7/1434* (2013.01); *G09G 3/2092* (2013.01)

(58) Field of Classification Search
CPC ........ G06F 1/16; G06F 1/1601; G06F 3/1423; A47F 5/04; H05K 5/0017; H05K 7/1423
See application file for complete search history.

(56) References Cited

U.S. PATENT DOCUMENTS

2002/0194623 A1* 12/2002 Rees .................... G06F 3/1423
725/148
2013/0100040 A1 4/2013 Haynes et al.

FOREIGN PATENT DOCUMENTS

| KR | 200211338 Y1 | 2/2001 |
|---|---|---|
| KR | 100919720 B1 | 10/2009 |

* cited by examiner

*Primary Examiner* — Larry Lee
(74) *Attorney, Agent, or Firm* — Cantor Colburn LLP

(57) ABSTRACT

A display apparatus includes a housing having a pillar shape, a plurality of monitors, and a driving unit received in the housing and providing driving signals to the plurality of monitors. Each of the plurality of monitors displays an image through its front surface and back surface and includes side surfaces connecting the front surface and the back surface. One side surface of the side surfaces of each of the plurality of monitors is coupled to the housing. A thickness of each of the plurality of monitors decreases as a distance from the housing increases.

20 Claims, 19 Drawing Sheets

FIG. 4A
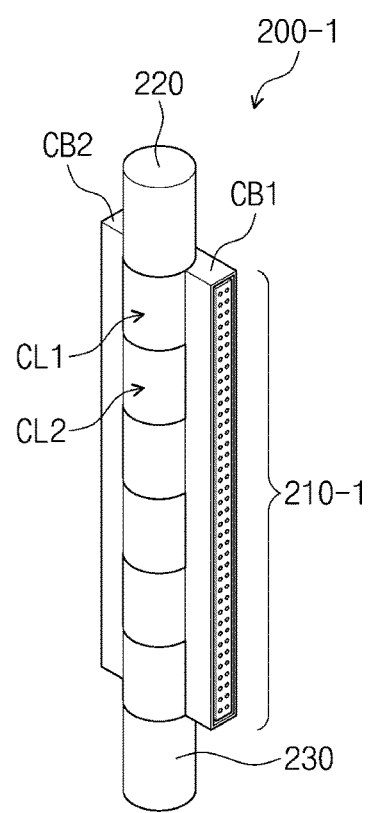
FIG. 4B
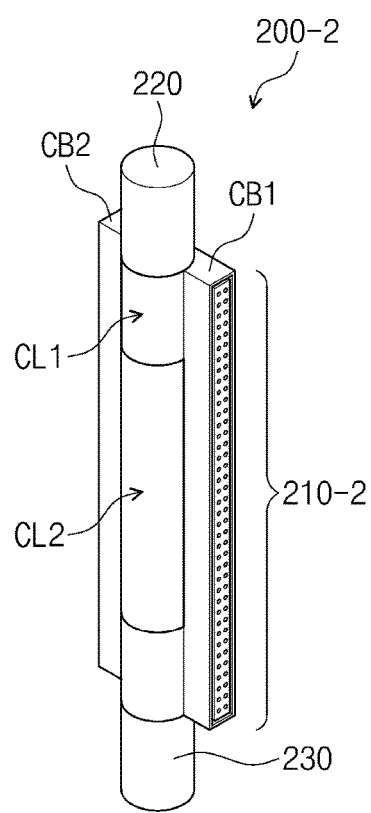
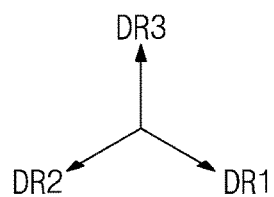
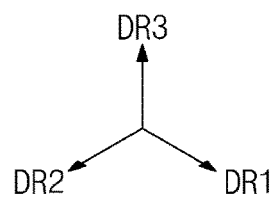

DISPLAY APPARATUS INCLUDING A HOUSING HAVING A PILLAR SHAPE, A PLURALITY OF ATTACHED MONITORS, AND A CENTRAL DRIVING UNIT

This application claims priority to Korean Patent Application No. 10-2016-0086302, filed on Jul. 7, 2016, and all the benefits accruing therefrom under 35 U.S.C. § 119, the content of which in its entirety is herein incorporated by reference.

BACKGROUND

1. Field

Exemplary embodiments of the invention relate to a display apparatus and, more particularly, to a display apparatus with improved durability and spatial efficiency.

2. Description of the Related Art

Display apparatuses are categorized as liquid crystal display ("LCD") apparatuses, organic light emitting display ("OLED") apparatuses, electro-wetting display ("EWD") apparatuses, plasma display panel ("PDP") apparatuses, and electrophoretic display ("EPD") apparatuses, for example.

The display apparatuses are mainly applied to a terminal monitor or a wall-mounted display apparatus and are also applied to portable devices such as a notebook personal computer ("PC") and a personal digital assistant ("PDA"). In other words, fields and ranges of use of the display apparatuses become more various and wider with a technical development of the display apparatuses. Thus, there is a demand for a display apparatus capable of improving user's convenience. For example, a display apparatus having various functions is demanded. In addition, it is desired to improve durability, space utilization, and thinness of a display apparatus.

SUMMARY

Exemplary embodiments of the invention provide a display apparatus with improved durability and spatial efficiency.

An exemplary embodiment of the invention provides a display apparatus including a housing having a pillar shape, a plurality of monitors, and a driving unit received in the housing and providing driving signals to the plurality of monitors. Each of the plurality of monitors displays an image through its front surface and back surface and includes side surfaces connecting the front surface and the back surface. One side surface of the side surfaces of each of the plurality of monitors is coupled to the housing. A thickness of each of the plurality of monitors decreases as a distance from the housing increases.

In an exemplary embodiment, the housing may include a plurality of hinge parts connected to the plurality of monitors in one-to-one correspondence and rotating with reference to a central axis of the housing.

In an exemplary embodiment, each of the plurality of hinge parts may include a cylinder part including at least one cylinder unit having a pillar shape, and a connection part connecting the cylinder part and the one side surface of each of the plurality of monitors.

In an exemplary embodiment, the cylinder parts may be arranged in a direction parallel to the central axis.

In an exemplary embodiment, the at least one cylinder unit of the cylinder part may be provided in plurality. The at least one cylinder units may be spaced apart from each other in a direction parallel to the central axis and be connected to the connection part.

In an exemplary embodiment, one of the at least one cylinder units of one of the cylinder parts may be disposed between two of the at least one cylinder units of another of the cylinder parts.

In an exemplary embodiment, a diameter of the cylinder part may be equal to or greater than a sum of widths of the one side surfaces respectively included in the plurality of monitors.

In an exemplary embodiment, the connection part may include at least one connecting terminal, and each of the plurality of monitors may include a connecting pin disposed at a side of each of the plurality of monitors and coupled to the at least one connecting terminal in one-to-one correspondence.

In an exemplary embodiment, a sliding groove extending in a direction parallel to the central axis may be defined in the connection part, and each of the plurality of monitors may include a sliding bar protruding from the one side surface of each of the plurality of monitors. The sliding bar may slide in the direction parallel to the central axis and be coupled to the sliding groove.

In an exemplary embodiment, the at least one connecting terminal may be disposed at an inner surface of the sliding groove, and the connecting pin may be disposed on at least one of a top surface and bottom surface of the sliding bar in the direction parallel to the central axis.

In an exemplary embodiment, the driving unit may include at least one main circuit board, and the at least one main circuit board may be received in an inner space of the cylinder part.

In an exemplary embodiment, the driving unit may further include a plurality of printed circuit boards ("PCBs"), and each of the plurality of PCBs may be received in an inner space of the connection part.

In an exemplary embodiment, the housing may include at least one coupling groove defined in a side surface of the housing, and the one side surface of each of the plurality of monitors may be inserted in the coupling groove.

In an exemplary embodiment, a cross section of the housing may have a polygonal shape.

In an exemplary embodiment, the housing further may include a cover part connected to an upper portion of the plurality of hinge parts, and a support part connected to a lower portion of the plurality of hinge parts.

In an exemplary embodiment, the housing further may include at least one connecting cylinder disposed between the cylinder parts connected to the plurality of monitors.

In an exemplary embodiment, the at least one connecting cylinder may have a bent shape, and directions of central axes of the cylinder parts connected to both ends of the at least one connecting cylinder may be different from each other.

In an exemplary embodiment, the housing may be provided in plurality, and the display apparatus may further include a guide rail disposed under the housings. The housings may move along the guide rail.

In an exemplary embodiment, at least one of a control button, a speaker, a microphone, and a camera module may be disposed at the housing.

Other exemplary embodiments of the invention provide a display apparatus including a housing having a pillar shape, a plurality of monitors, and a driving unit received in the housing and providing driving signals to the plurality of monitors. Each of the plurality of monitors includes a front surface displaying an image, a back surface opposite to the front surface, and a plurality of side surfaces connecting the front surface and the back surface. One side surface of the plurality of side surfaces is coupled to the housing. A thickness of each of the plurality of monitors decreases as a distance from the housing increases.

BRIEF DESCRIPTION OF THE DRAWINGS

The above and other exemplary embodiments, advantages and features of this disclosure will become more apparent in view of the attached drawings and accompanying detailed description.

FIG. 4A is a perspective view illustrating other exemplary embodiments of a housing according to the invention.

FIG. 4B is a perspective view illustrating other exemplary embodiments of a housing according to the invention.

DETAILED DESCRIPTION

Figure 1:
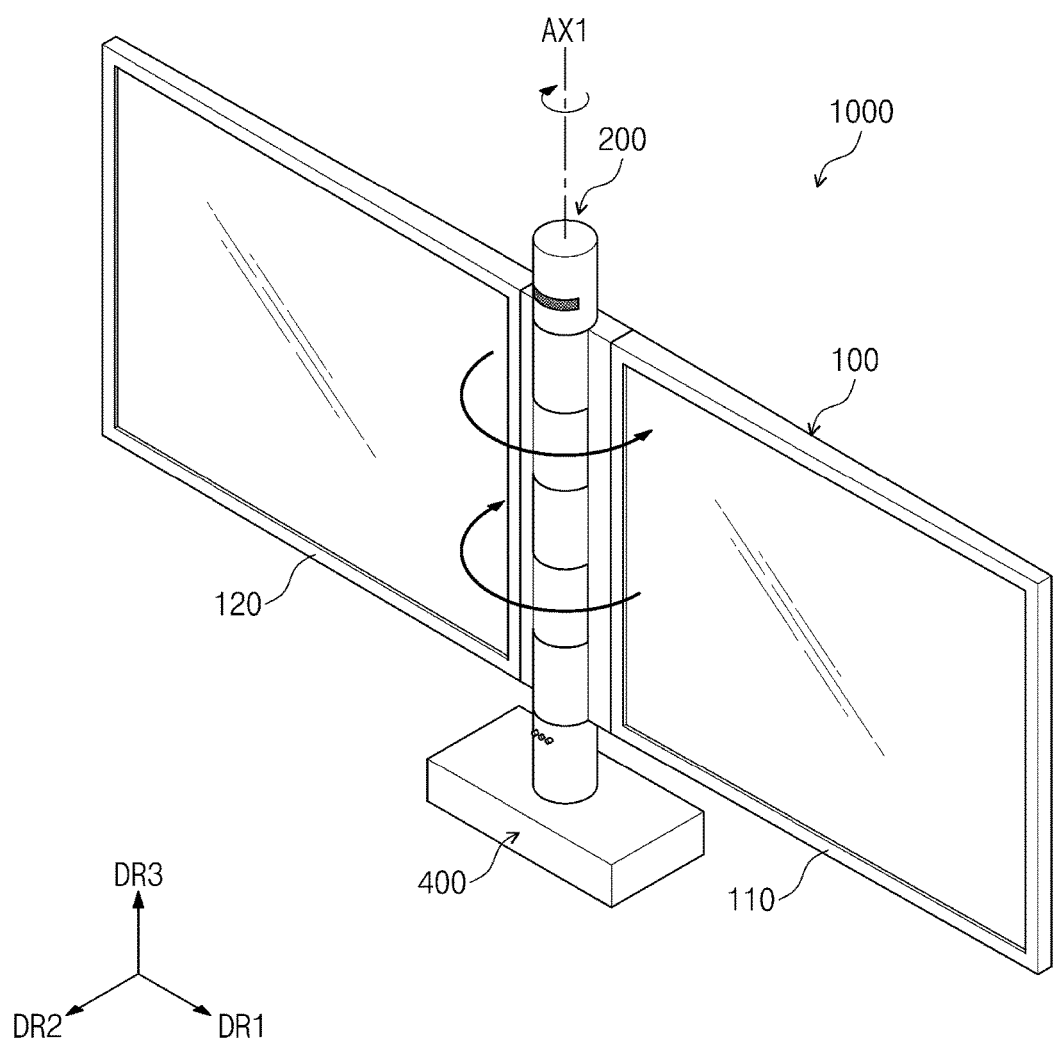
FIG. 1 is a perspective view illustrating exemplary embodiments of a display apparatus according to the invention.

The advantages and features of the invention and methods of achieving them will be apparent from the following exemplary embodiments that will be described in more detail with reference to the accompanying drawings. It should be noted, however, that the invention is not limited to the following exemplary embodiments, and may be implemented in various forms. Accordingly, the exemplary embodiments are provided only to disclose the invention and let those skilled in the art know the category of the invention. In the drawings, embodiments of the invention is not limited to the specific examples provided herein and are exaggerated for clarity.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Moreover, exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. In an exemplary embodiment, an etching region illustrated as a rectangle will, typically, have rounded or curved features, for example. Thus, the regions illustrated in the drawings are schematic in nature and their shapes are not intended to illustrate the actual shape of a region of a device and are not intended to limit the scope of exemplary embodiments.

Hereinafter, exemplary embodiments of the invention will be described in more detail with reference to the accompanying drawings.

Figure 2:
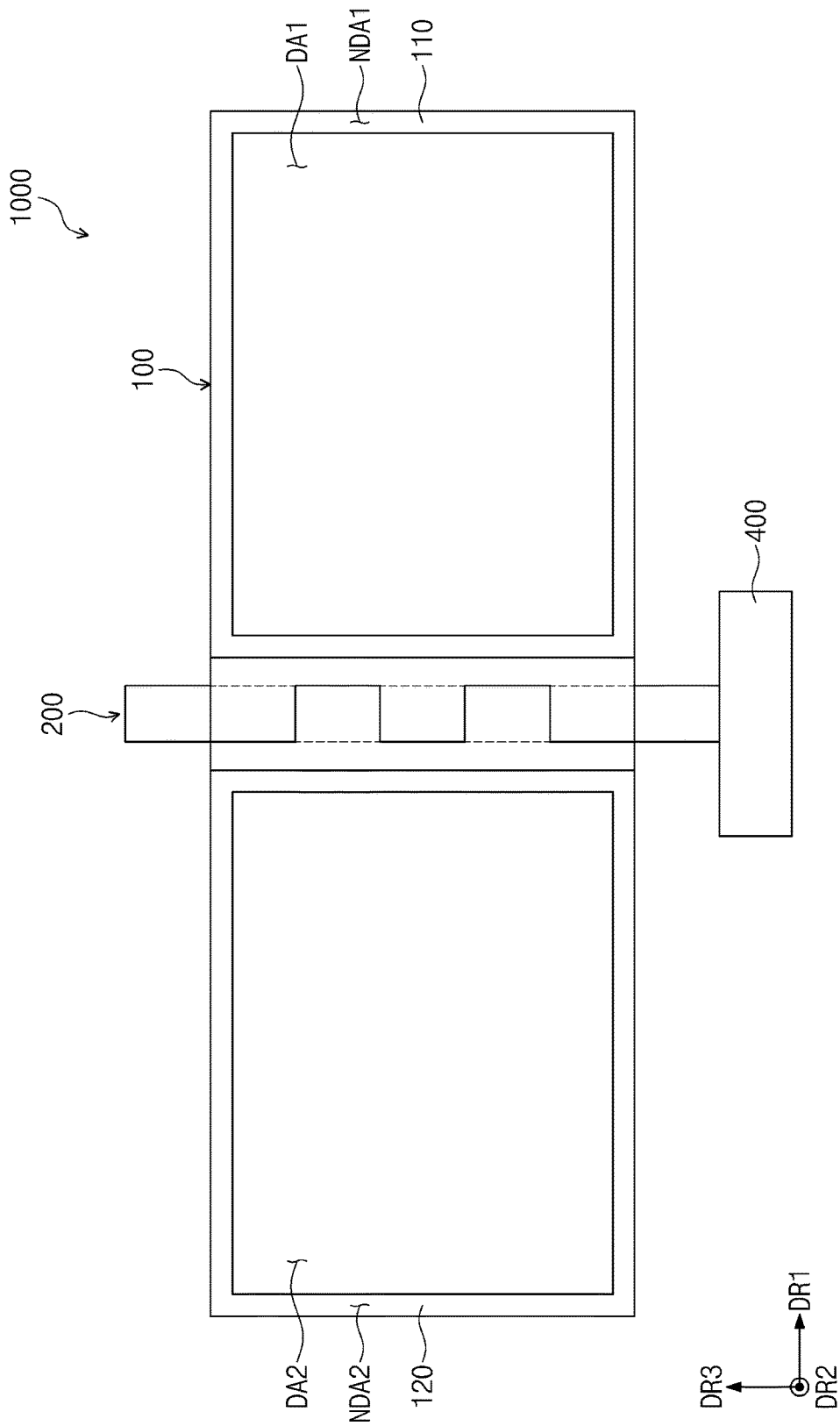
FIG. 2 is a front view of the display apparatus illustrated in FIG. 1.

FIG. 1 is a perspective view illustrating a display apparatus according to exemplary embodiments of the invention. FIG. 2 is a front view of the display apparatus illustrated in FIG. 1.

Referring to FIGS. 1 and 2, a display apparatus 1000 according to exemplary embodiments of the invention includes a monitor part 100, a housing 200, and a driving unit (not shown).

The monitor part 100 includes a first monitor 110 and a second monitor 120. In an exemplary embodiment, each of the first and second monitors 110 and 120 has a quadrilateral plate shape, for example. However, the invention is not limited to the shape of the monitor part 100. In another exemplary embodiment, the first monitor 110 may have a quadrilateral plate shape but the second monitor 120 may have a half-moon shape or a triangular shape, for example.

In FIGS. 1 and 2, a size of the first monitor 110 is equal to a size of the second monitor 120. However, the invention is not limited thereto. In other exemplary embodiments, the size of the first monitor 110 may be different from the size of the second monitor 120.

Each of the first and second monitors 110 and 120 includes a front surface, a back surface opposite to the front surface, and side surfaces connecting the front surface and the back surface. The first and second monitors 110 and 120 may display images through the front surfaces and the back surfaces. However, the invention is not limited thereto. In exemplary embodiments, each of the first and second monitors 110 and 120 may display the image through any one of the front surface and the back surface. In an exemplary embodiment, even though not shown in the drawings, when the image is displayed on one of the front and back surfaces of each of the first and second monitors 110 and 120, the other of the front and back surfaces may have a mirror function, for example.

Hereinafter, components of the front surface may be the same as those of the back surface in each of the first and second monitors 110 and 120, and thus the components of the front surface will be described but descriptions to the components of the back surface will be omitted.

A first display area DA1 and a first non-display area NDA1 surrounding the first display area DA1 are defined at the first monitor 110. The image may be provided through the first display area DA1.

A second display area DA2 and a second non-display area NDA2 surrounding the second display area DA2 are defined at the second monitor 120. The image may be provided through the second display area DA2. The image displayed in the second display area DA2 may be same with or different from the image displayed in the first display area DA1.

The housing 200 connects the first monitor 110 and the second monitor 120. In an exemplary embodiment, the housing 200 may have a pillar shape, for example. A side surface of the housing 200 is connected to one of the side surfaces of the first monitor 110 and one of the side surfaces of the second monitor 120.

Each of the first and second monitors 110 and 120 may rotate with reference to a central axis AX1 of the housing 200. In detail, the first monitor 110 and the second monitor 120 may rotate in a circular orbit on a plane defined by a first direction DR1 and a second direction DR2. At this time, the housing 200 extends in a third direction DR3 perpendicular to the first and second directions DR1 and DR2. In other words, the central axis AX1 of the housing 200 is parallel to the third direction DR3.

A distance between the central axis AX1 and one side surface, connected to the housing 200, of the side surfaces of each of the first and second monitors 110 and 120 is shorter than a distance between the central axis AX1 and another side surface, opposite to the one side surface, of the side surfaces of each of the first and second monitors 110 and 120. Thus, a rotational orbit of the another side surface, opposite to the one side surface, of the side surfaces of each of the first and second monitors 110 and 120 has a greater radius than a rotational orbit of the one side surface, connected to the housing 200, of the side surfaces of each of the first and second monitors 110 and 120.

The driving unit 300 (refer to FIG. 3B) may be received within the housing 200. The driving unit 300 may respectively provide driving signals to each of the first and second monitors 110 and 120. In an exemplary embodiment, the driving signals may be the same with or different from each other.

The display apparatus 1000 may further include a supporter 400. The supporter 400 is connected to a lower portion of the housing 200 to fix the housing 200. In another exemplary embodiment, the supporter 400 may be omitted.

Hereinafter, the housing 200 will be described in more detail with reference to FIGS. 3A, 3B, 4A, and 4B.

Figure 3A:
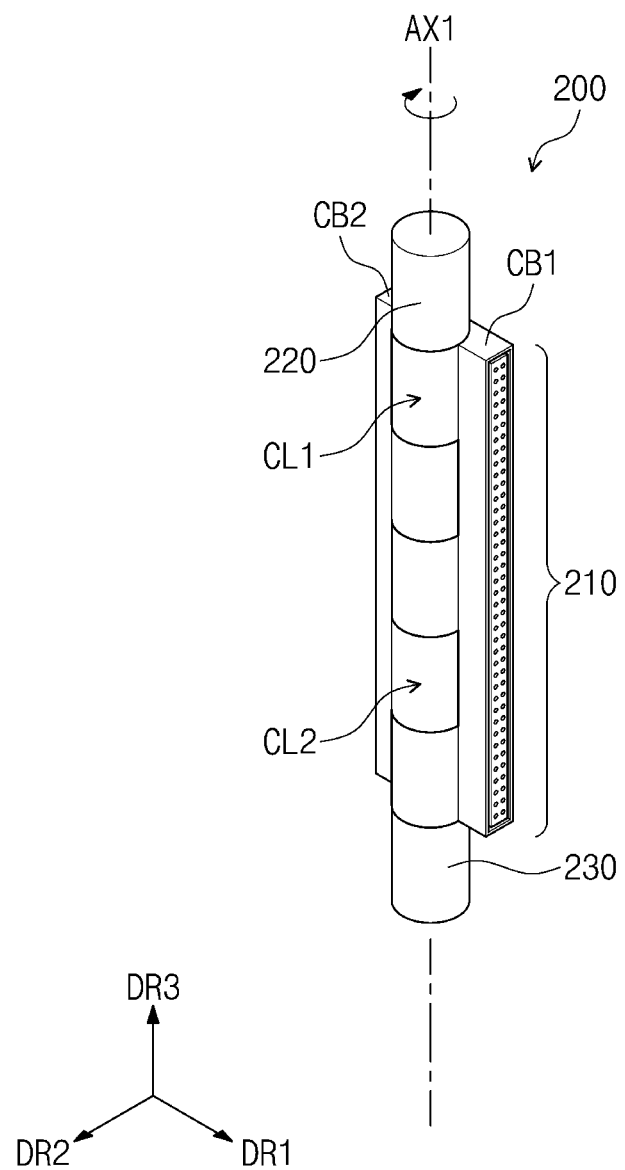
FIG. 3A is a perspective view of a housing illustrated in FIG. 1.
Figure 3B:
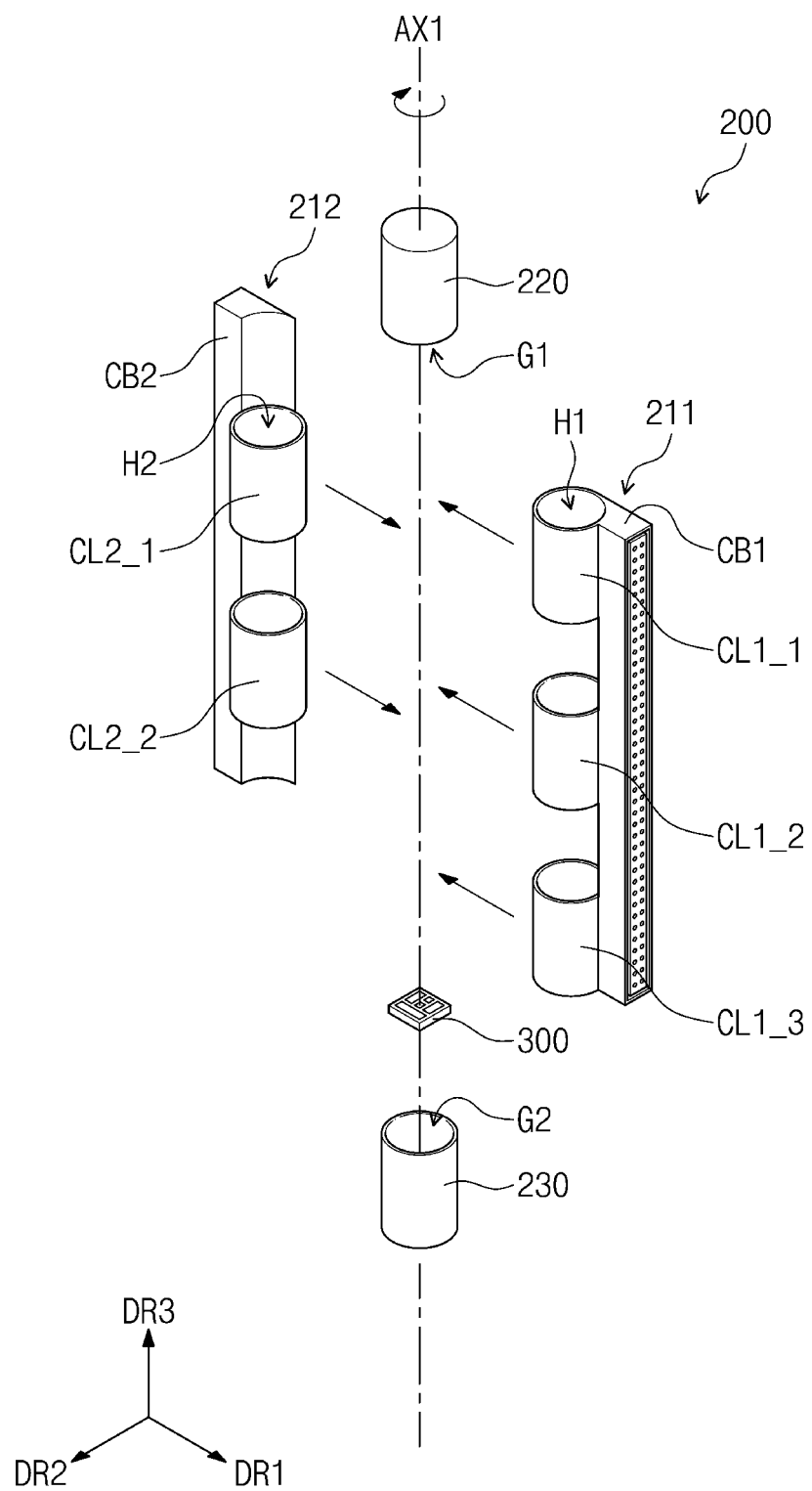
FIG. 3B is an exploded perspective view of the housing illustrated in FIG. 1.

FIG. 3A is a perspective view of the housing illustrated in FIG. 1, and FIG. 3B is an exploded perspective view of the housing illustrated in FIG. 1. FIGS. 4A and 4B are perspective views illustrating housings according to other exemplary embodiments of the invention.

Referring to FIGS. 1, 2, 3A, and 3B, the housing 200 includes a body part 210, a cover part 220, and a support part 230. The body part 210 is disposed between the cover part 220 and the support part 230. The body part 210, the cover part 220, and the support part 230 are connected to one another to constitute a shape of one body.

The body part 210 includes a first hinge part 211 and a second hinge part 212. The first hinge part 211 is connected to the first monitor 110, and the second hinge part 212 is connected to the second monitor 120.

In detail, the first hinge part 211 includes a first cylinder part CL1 and a first connection part CB1. The first cylinder part CL1 includes a plurality of first cylinder units CL1_1 to CL1_3. In an exemplary embodiment, each of the first cylinder units CL1_1 to CL1_3 has a hollow cylindrical shape extending in the third direction DR3, for example. In other words, a first hole H1 extending in the third direction DR3 may be defined in each of the first cylinder units CL1_1 to CL1_3.

The first connection part CB1 has a bar shape extending in the third direction DR3. A side surface of each of the first cylinder units CL1_1 to CL1_3 is coupled to the first connection part CB1. The first cylinder units CL1_1 to CL1_3 are spaced apart from one another in the third direction DR3 and are disposed on a side surface of the first connection part CB1.

The second hinge part 212 includes a second cylinder part CL2 and a second connection part CB2. The second cylinder part CL2 includes a plurality of second cylinder units CL2_1 and CL2_2. Each of the second cylinder units CL2_1 and CL2_2 has a hollow cylindrical shape extending in the third direction DR3. In other words, a second hole H2 extending in the third direction DR3 may be defined in each of the second cylinder units CL2_1 and CL2_2.

The second connection part CB2 has a bar shape extending in the third direction DR3. A side surface of each of the second cylinder units CL2_1 and CL2_2 is coupled to the second connection part CB2. The second cylinder units CL2_1 and CL2_2 are spaced apart from each other in the third direction DR3 and are disposed on a side surface of the second connection part CB2.

The first cylinder part CL1 and the second cylinder part CL2 are coupled to each other to constitute one cylinder shape. In more detail, the first cylinder units CL1_1 to CL1_3 of the first cylinder part CL1 may be coupled to the second cylinder units CL2_1 and CL2_2 of the second cylinder part CL2. One of the second cylinder units CL2_1 and CL2_2 of the second cylinder part CL2 may be disposed between adjacent two of the first cylinder units CL1_1 to CL1_3 of the first cylinder part CL1.

The first cylinder part CL1 and the second cylinder part CL2 have the same central axis AX1. A rotational trace of the first monitor 110 overlaps a rotational trace of the second monitor 120 on a plane perpendicular to the central axis AX1. In other words, the rotational trace of the first monitor 110 overlaps the rotational trace of the second monitor 120 on the plane defined by the first and second directions DR1 and DR2.

In addition, the rotational trace of the first monitor 110 may overlap the rotational trace of the second monitor 120 on one plane including the central axis AX1. In other words, according to exemplary embodiments of the invention, the front surface of the first monitor 110 may contact the front surface of the second monitor 120. Hereinafter, the arrangement type of the monitors 110 and 120 in the illustrated exemplary embodiment is defined as a parallel arrangement type.

Even though not shown in the drawings, in other exemplary embodiments, the body part 210 may further include at least one connecting cylinder which connects the first cylinder units CL1_1 to CL1_3 to the second cylinder units CL2_1 and CL2_2. In this case, the first cylinder units CL1_1 to CL1_3, the second cylinder units CL2_1 and CL2_2, and the connecting cylinder may be coupled to each other to constitute one cylinder shape.

FIGS. 3A and 3B illustrate the body part 210 including three first cylinder units CL1_1 to CL1_3 and two second cylinder units CL2_1 and CL2_2. However, the invention is not limited to the numbers of the cylinder units CL1_1 to CL1_3 and CL2_1 and CL2_2.

As illustrated in FIG. 4A, a first cylinder part CL1 and a second cylinder part CL2 of the body part 210-1 of the housing 200-1 of a display apparatus according to other exemplary embodiments may include the same number of cylinder units, for example.

In an alternative exemplary embodiment, as illustrated in FIG. 4B, a first cylinder part CL1 of the body part 210-2 of the housing 200-2 of a display apparatus may include two cylinder units coupled to both end portions of a first connection part CB1, and a second cylinder part CL2 of the display apparatus may include one cylinder unit coupled between both end portions of a second connection part CB2. The cylinder unit of the second cylinder part CL2 is disposed between the cylinder units of the first cylinder part CL1.

According to exemplary embodiments of the invention, each of the first and second cylinder parts CL1 and CL2 may rotate on the central axis AX1. Since each of the first and second cylinder parts CL1 and CL2 rotates, the first and second monitors 110 and 120 of FIG. 1 respectively connected to the first and second connection parts CB1 and CB2 may rotate. At this time, rotational directions of the first and second monitors 110 and 120 of FIG. 1 are not limited.

The cover part 220 is disposed on the body part 210 so as to be connected to the body part 210. According to exemplary embodiments of the invention, the cover part 220 may have a cylindrical shape and a recess G1 may be recessed upward from a bottom surface of the cover part 220. The recess G1 is connected to the first hole H1 or the second hole H2. However, the invention is not limited to the shape of the cover part 220. In other exemplary embodiments, the recess G1 may not be provided in the cover part 220, for example. In still other exemplary embodiments, a third hole (not shown) extending in the third direction DR3 may be provided in the cover part 220.

The support part 230 is disposed under the body part 210 so as to be connected to the body part 210. According to exemplary embodiments of the invention, the support part 220 may have a cylindrical shape and a recess G2 may be recessed downward from a top surface of the support part 230. The recess G2 is connected to the first hole H1 or the second hole H2. However, the invention is not limited to the shape of the support part 230. In other exemplary embodiments, the recess G2 may not be provided in the support part 230. In still other exemplary embodiments, a fourth hole (not shown) extending in the third direction DR3 may be provided in the support part 230.

In other exemplary embodiments of the invention, the cover part 220 and the support part 230 may be omitted.

A driving unit 300 is received in at least one of an inner space defined by the first and second cylinder parts CL1 and CL2, the recess G1 of the cover part 220, or the recess G2 of the support part 230. The driving unit 300 may include a main circuit board. In addition, even though not shown in the drawings, the driving unit 300 may further include a plurality of interconnection lines (not shown) and a plurality of printed circuit boards ("PCBs") (not shown).

In the exemplary embodiment of the invention, the driving unit 300 is received in at least one of the inner space defined by the first and second cylinder parts CL1 and CL2, the recess G1 of the cover part 220, or the recess G2 of the support part 230. However, the invention is not limited to the space in which the driving unit 300 is received. In other exemplary embodiments, the driving unit 300 may be embedded in at least one of the body part 210, the cover part 220, or the support part 230, for example.

Figure 5A:
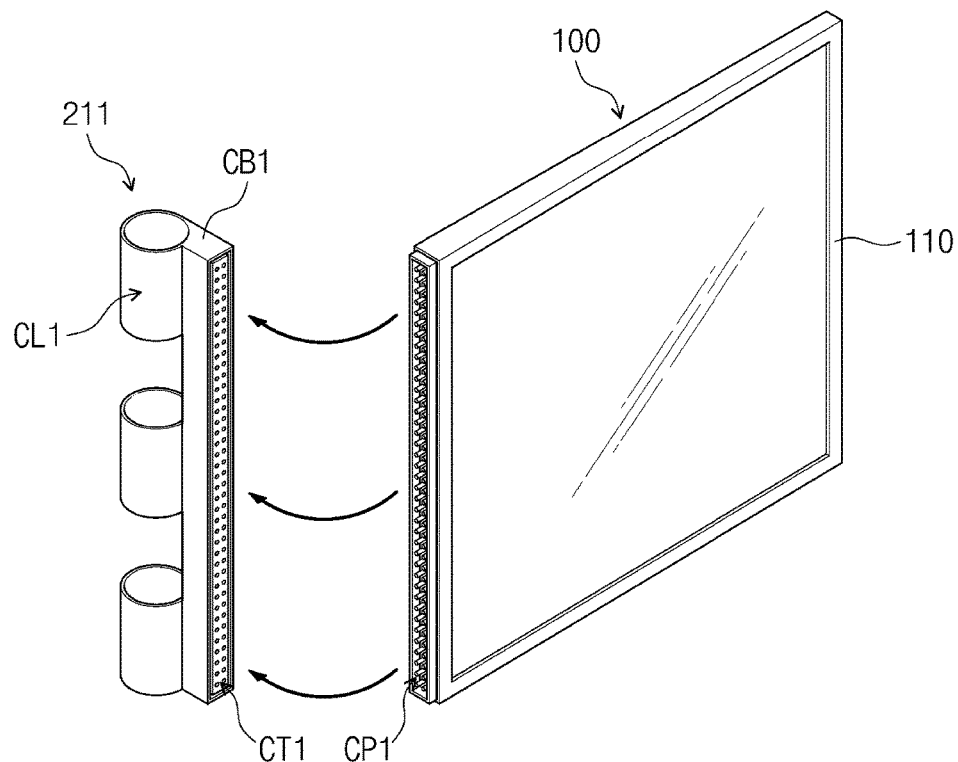
FIG. 5A is a perspective view illustrating exemplary embodiments of a first monitor and a first hinge part according to the invention.
Figure 5B:
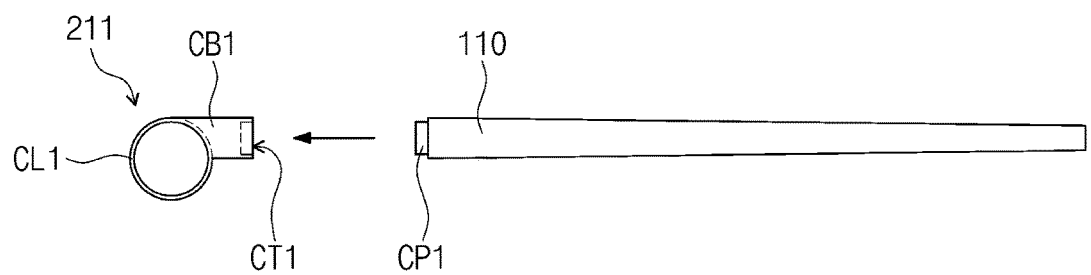
FIG. 5B is a top view illustrating the first monitor and the first hinge part.

FIG. 5A is a perspective view illustrating the first monitor and the first hinge part, and FIG. 5B is a top view illustrating the first monitor and the first hinge part. The connection relation between the first monitor 110 and the first hinge part 211 may be the same as the connection relation between the second monitor 120 and the second hinge part 212, and thus illustration and descriptions of the second monitor 120 and the second hinge part 212 will be omitted.

Referring to FIGS. 5A and 5B, one side surface of the first connection part CB1 of the first hinge part 211 may be connected to the first cylinder part CL1, and another side surface of the first connection part CB1 opposite to the one side surface may be connected to the first monitor 110.

In more detail, the first connection part CB1 includes a first connecting terminal CT1 disposed at the another side surface of the first connection part CB1, and the first monitor 110 includes a first connecting pin CP1 disposed at one side surface, connected to the first connection part CB1, of the side surfaces of the first monitor 110. The first connecting pin CP1 may be coupled to the first connecting terminal CT1, and thus the first connection part CB1 may be connected to the first monitor 110.

However, the invention is not limited to the coupling type of the first connection part CB1 and the first monitor 110. In other exemplary embodiments, the first connection part CB1 and the first monitor 110 may be connected to each other by a combination of a groove and a protrusion, by magnetic force, or by another coupling member such as a nail or a screw, for example.

In addition, the first connecting terminal CT1 of the first connection part CB1 may be electrically connected to the first connecting pin CP1 of the first monitor 110. The first connection part CB1 may transmit a driving signal, provided from the driving unit 300 received in the housing 200, to the connecting pin CP1 of the first monitor 110 through the first connecting terminal CT1. The first monitor 110 may display an image in response to the transmitted driving signal.

However, the invention is not limited to the signal transmission method between the first connection part CB1 and the first monitor 110. In other exemplary embodiments, the first monitor 110 may receive the driving signal from the first connection part CB1 through a local area network (e.g., bluetooth).

Figure 6:
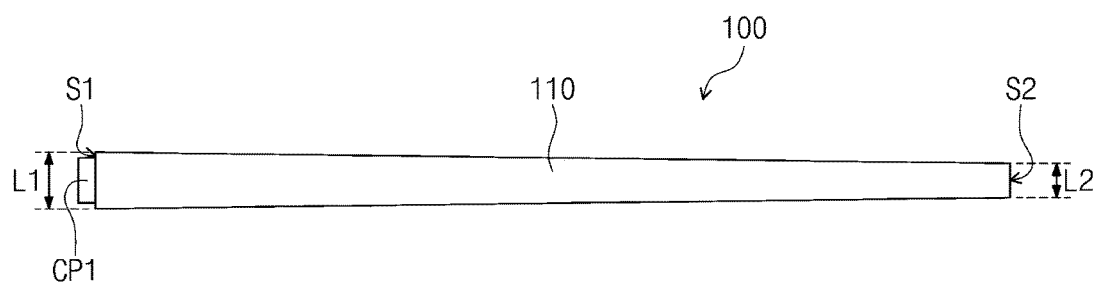
FIG. 6 is a top view illustrating the first monitor.

FIG. 6 is a top view illustrating the first monitor according to exemplary embodiments of the invention. The first monitor 110 may have the same components as the second monitor 120, and thus illumination and descriptions of the second monitor 120 will be omitted.

Referring further to FIG. 6, a thickness of the first monitor 110 may gradually decrease as a distance from the first connection part CB1 (refer to FIG. 5B) increases. In more detail, a side surface, connected to the first connection part CB1, of the side surfaces of the first monitor 110 is defined as a first surface S1. A side surface, opposite to the first surface Si, of the side surfaces of the first monitor 110 is defined as a second surface S2. When a thickness of the first surface Si is a first length L1 and a thickness of the second surface S2 is a second length L2, the second length L2 may be smaller than the first length L1.

In other words, according to exemplary embodiments of the invention, since the thickness of the first monitor 110 decreases as a distance from the first connection part CB1 increases, the center of gravity of the first monitor 110 may be adjacent to the first connection part CB1. Thus, it is possible to inhibit or reduce failure which may occur at a connecting portion between the first monitor 110 and the first connection part CB1 by a weight of the first monitor 110. In other words, durability of the display apparatus 1000 may be improved.

Figure 7:
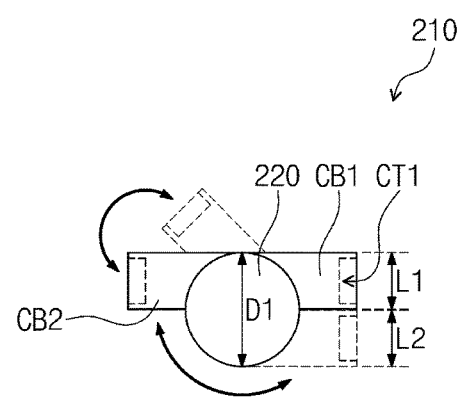
FIG. 7 is a top view illustrating exemplary embodiments of a body part according to the invention.

FIG. 7 is a top view illustrating a body part according to exemplary embodiments of the invention.

Referring to FIG. 7, each of the first cylinder part CL1 (refer to FIGS. 3A to 4B), the second cylinder part CL2 (refer to FIGS. 3A to 4B), the cover part 220, and the support part 230 (refer to FIGS. 3A to 4B) may have a first diameter D1. When a thickness of the first connection part CB1 is a first length L1 and a thickness of the second connection part CB2 is a second length L2, the first diameter D1 may be equal to or greater than a sum of the first length L1 and the second length L2.

In addition, in exemplary embodiments, a back surface of the first connection part CB1 and a back surface of the second connection part CB2 may overlap a tangent plane of a cylinder provided by the first cylinder part CL1, the second cylinder part CL2, the cover part 220 and the support part 230 which are coupled to each other. However, the invention is not limited thereto. In other exemplary embodiments, a front surface of the first connection part CB1 and a front surface of the second connection part CB2 may overlap the tangent plane of the cylinder.

Figure 8:
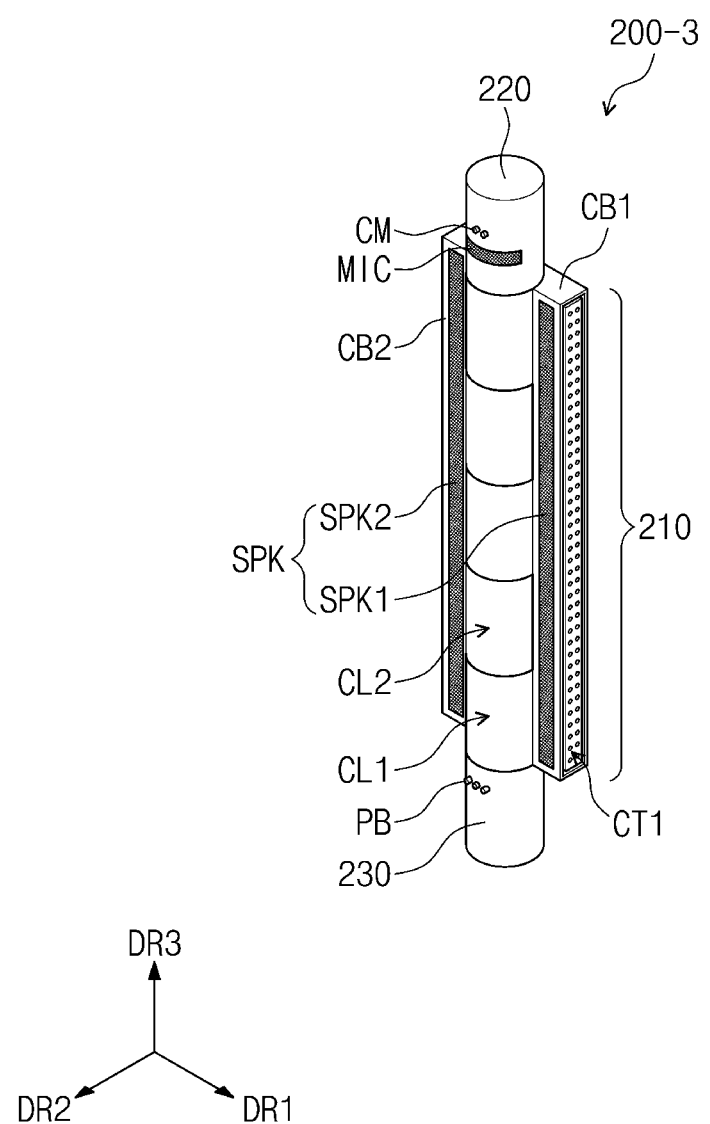
FIG. 8 is a perspective view illustrating other exemplary embodiments of a housing according to the invention.

FIG. 8 is a perspective view illustrating a housing according to other exemplary embodiments of the invention.

Referring to FIG. 8, a housing 200-3 according to other exemplary embodiments may further include additional function devices SPK, PB, CM, and MIC. The additional function devices may include a speaker SPK, a control button PB (e.g., a power button), a camera module CM, and a microphone MIC. The additional function devices SPK, PB, CM, and MIC may be disposed at the housing 200-3. In more detail, the additional function devices SPK, PB, CM, and MIC may be disposed at the first and second cylinder parts CL1 and CL2, the first and second connection parts CB1 and CB2, the cover part 220, and the support part 230. In an exemplary embodiment, the speaker SPK may include a first speaker member SPK1 and a second speaker member SPK2 respectively provided on the first and second connection parts CB1 and CB2.

However, the invention is not limited to kinds of the additional function devices. In other exemplary embodiments, the housing 200-3 may further include additional function devices such as an infrared sensor, a bluetooth sensor, and a status display screen.

In still other exemplary embodiments, the additional function devices may be disposed at the non-display area, e.g., NDA1 or NDA2 of FIG. 2, of the monitor part as well as the housing 200-3.

Figure 9:
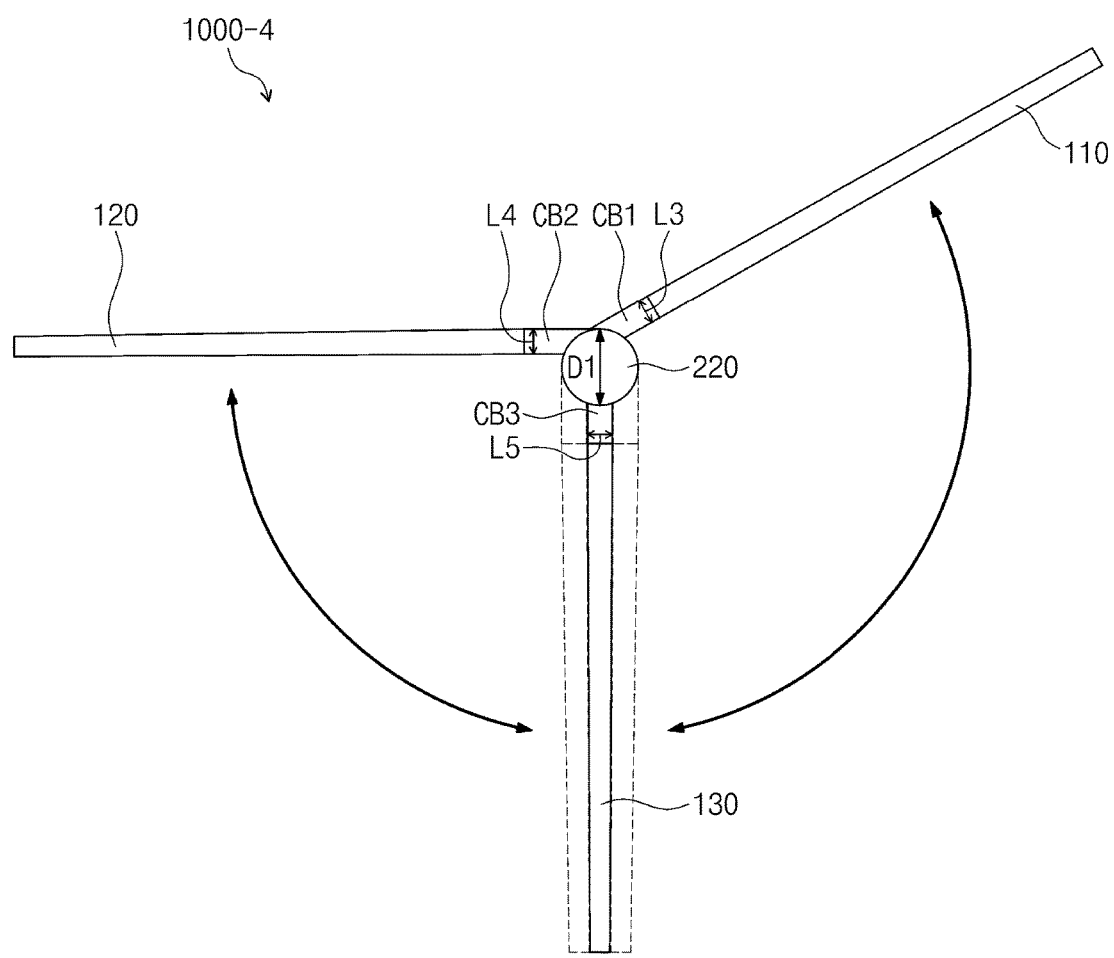
FIG. 9 is a top view illustrating other exemplary embodiments of a display apparatus according to the invention.

FIG. 9 is a top view illustrating a display apparatus according to other exemplary embodiments of the invention. In the exemplary embodiments of FIG. 9, the same elements as in the exemplary embodiments described above will be indicated by the same reference numerals or the same reference designators, and the descriptions thereto will be omitted or mentioned briefly.

Referring to FIG. 9, a display apparatus 1000-4 according to other exemplary embodiments of the invention further includes a third monitor 130. In addition, a body part 210 according to other exemplary embodiments further includes a third connection part CB3 and a third cylinder part (not shown).

The third monitor 130 is connected to the third connection part CB3. The third connection part CB3 is connected to the third cylinder part (not shown). The third cylinder part (not shown) is connected to the first cylinder part CL1 and the second cylinder part CL2 to form one cylinder shape.

The first to third monitors 110, 120, and 130 may be arranged in the parallel arrangement type. Thus, a back surface of the third monitor 130 may contact the front surface of the first monitor 110, and a front surface of the third monitor 130 may contact the front surface of the second monitor 120.

In addition, in the illustrated exemplary embodiment, a thickness of the first connection part CB1 may be a third length L3, a thickness of the second connection part CB2 may be a fourth length L4, and a thickness of the third connection part CB3 may be a fifth length L5. A first diameter D1 may be equal to or greater than a sum of the third to fifth lengths L3, L4, and L5.

In FIG. 9, three monitors 110, 120, and 130 are connected to one housing. However, the invention is not limited to the number of the monitors.

Figure 10:
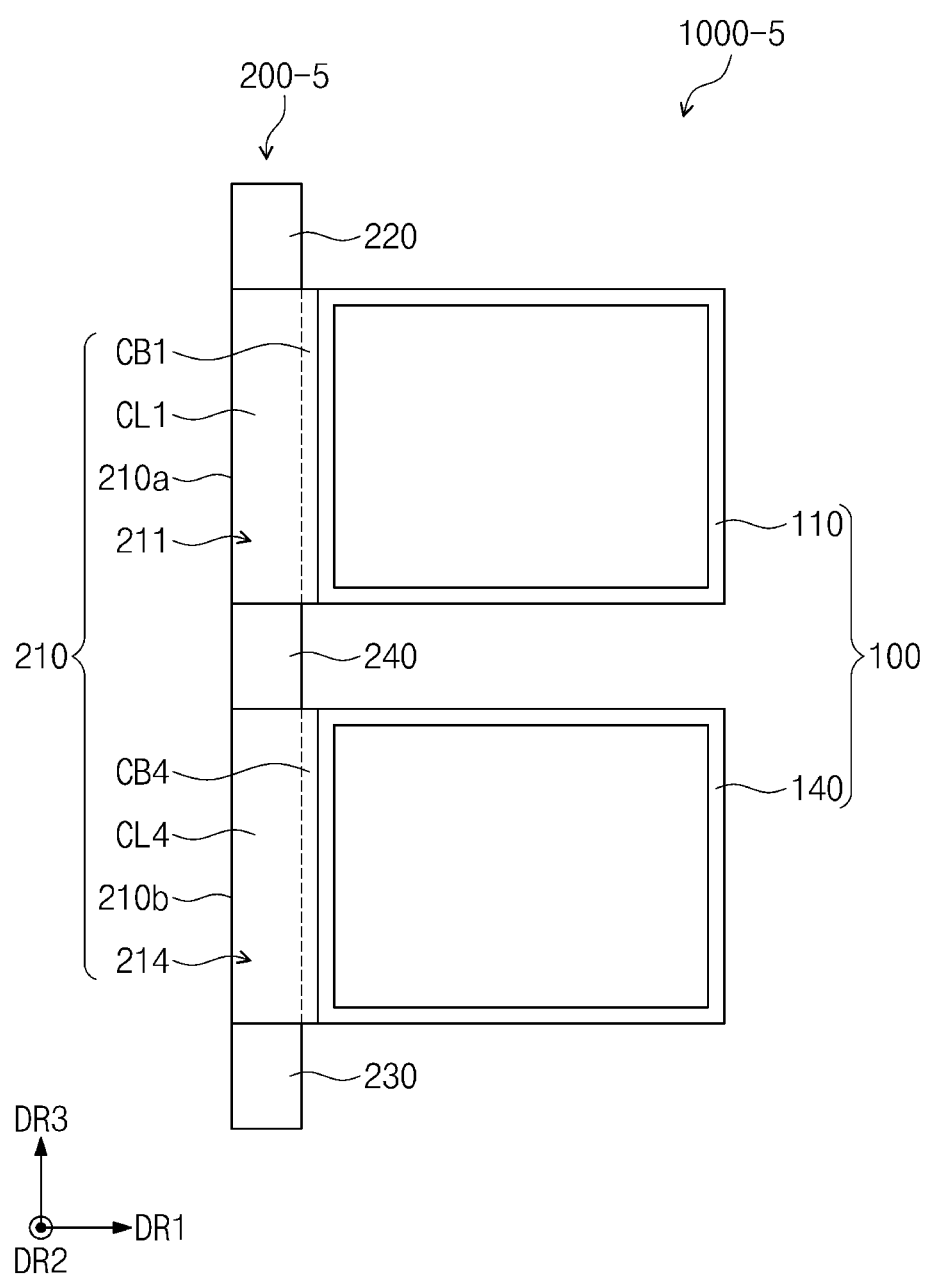
FIG. 10 is a front view illustrating other exemplary embodiments of a display apparatus according to the invention.
Figure 11:
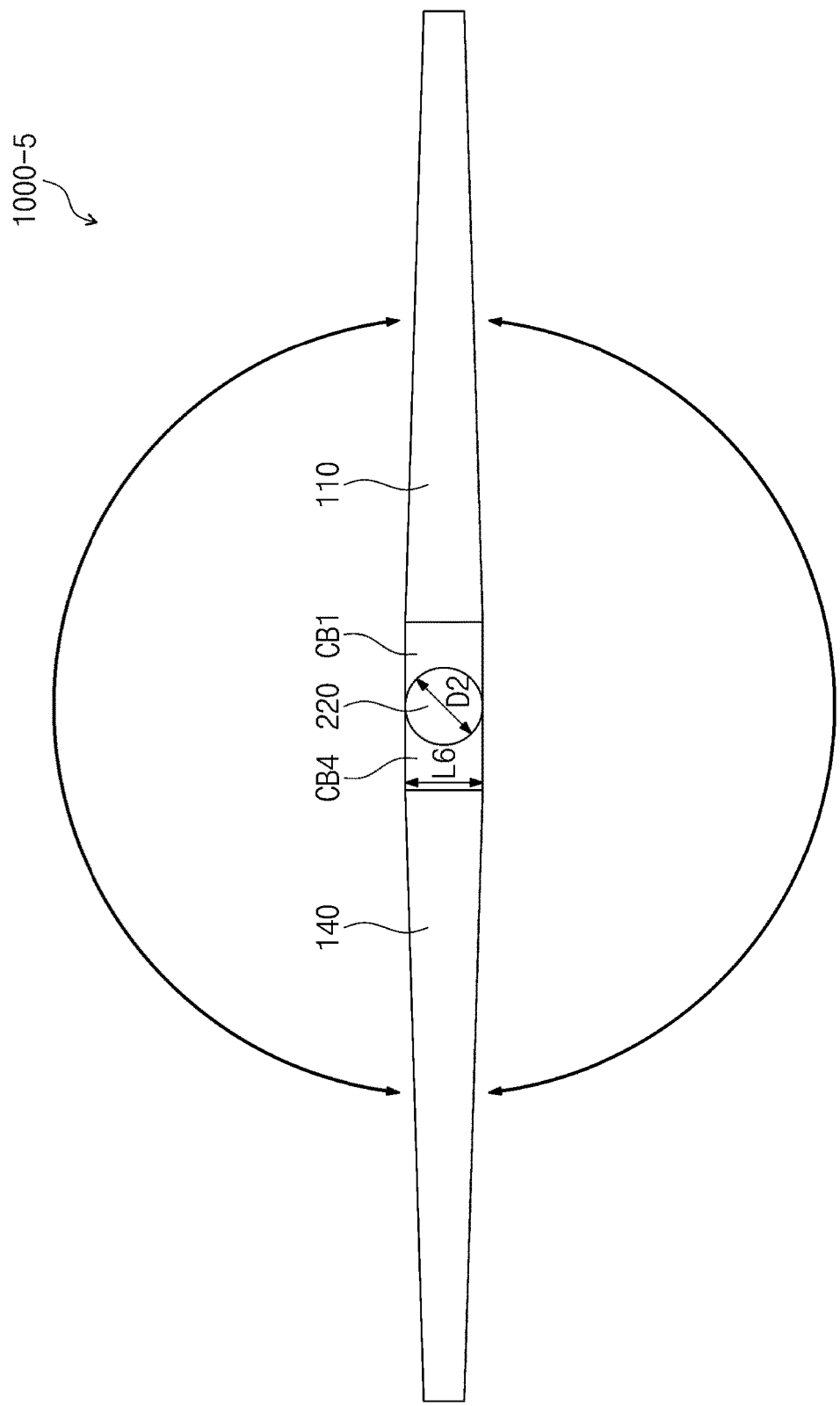
FIG. 11 is a top view of the display apparatus illustrated in FIG. 10.

FIG. 10 is a front view illustrating a display apparatus according to other exemplary embodiments of the invention, and FIG. 11 is a top view of the display apparatus illustrated in FIG. 10. In the exemplary embodiments of FIGS. 10 and 11, the same elements as in the exemplary embodiments described above will be indicated by the same reference numerals or the same reference designators, and the descriptions thereto will be omitted or mentioned briefly.

Referring to FIGS. 10 and 11, a display apparatus 1000-5 according to other exemplary embodiments includes a first monitor 110, a housing 200-5, a body part 210 including a first body part member 210a and a second body part member 210b, a first hinge part 211, a fourth monitor 140, and a fourth hinge part 214. The fourth monitor 140 is disposed under the first monitor 110. In other words, the fourth hinge part 214 is disposed under the first hinge part 211.

A rotational trace of the first monitor 110 and a rotational trace of the fourth monitor 140 may overlap each other on a plane perpendicular to the central axis AX1. In other words, the rotational trace of the first monitor 110 and the rotational trace of the fourth monitor 140 may overlap each other on a plane defined by the first direction DR1 and the second direction DR2.

However, the rotational trace of the first monitor 110 and the rotational trace of the fourth monitor 140 do not overlap each other on one plane including the central axis AX1. In other words, according to exemplary embodiments of the invention, the first monitor 110 does not contact the fourth monitor 140. Hereinafter, the arrangement type of the monitors 110 and 140 in the illustrated exemplary embodiment is defined as a series arrangement type.

The display apparatus 1000-5 according to the illustrated exemplary embodiment may further include a first connecting cylinder 240 disposed between the first hinge part 211 and the fourth hinge part 214. In more detail, the first connecting cylinder 240 is disposed between a first cylinder part CL1 of the first hinge part 211 and a fourth cylinder part CL4 of the fourth hinge part 214. The first connecting cylinder 240, the first cylinder part CL1, and the fourth cylinder part CL4 may be connected to one another to constitute one cylinder shape. The first connecting cylinder 240 does not rotate.

According to the illustrated exemplary embodiment, each of the first cylinder part CL1, the fourth cylinder part CL4, the cover part 220, and the support part 230 has a second diameter D2. When a thickness of each of the first and fourth monitors 110 and 140 is a sixth length L6, the second diameter D2 is equal to or greater than the sixth length L6.

In addition, in the illustrated exemplary embodiment, both a front surface and a back surface of each of the first and fourth connection parts CB1 and CB4 may overlap a tangent plane of a cylinder provided by the first cylinder part CL1, the fourth cylinder part CL4, the cover part 220 and the support part 230 which are coupled to one another.

Figure 12:
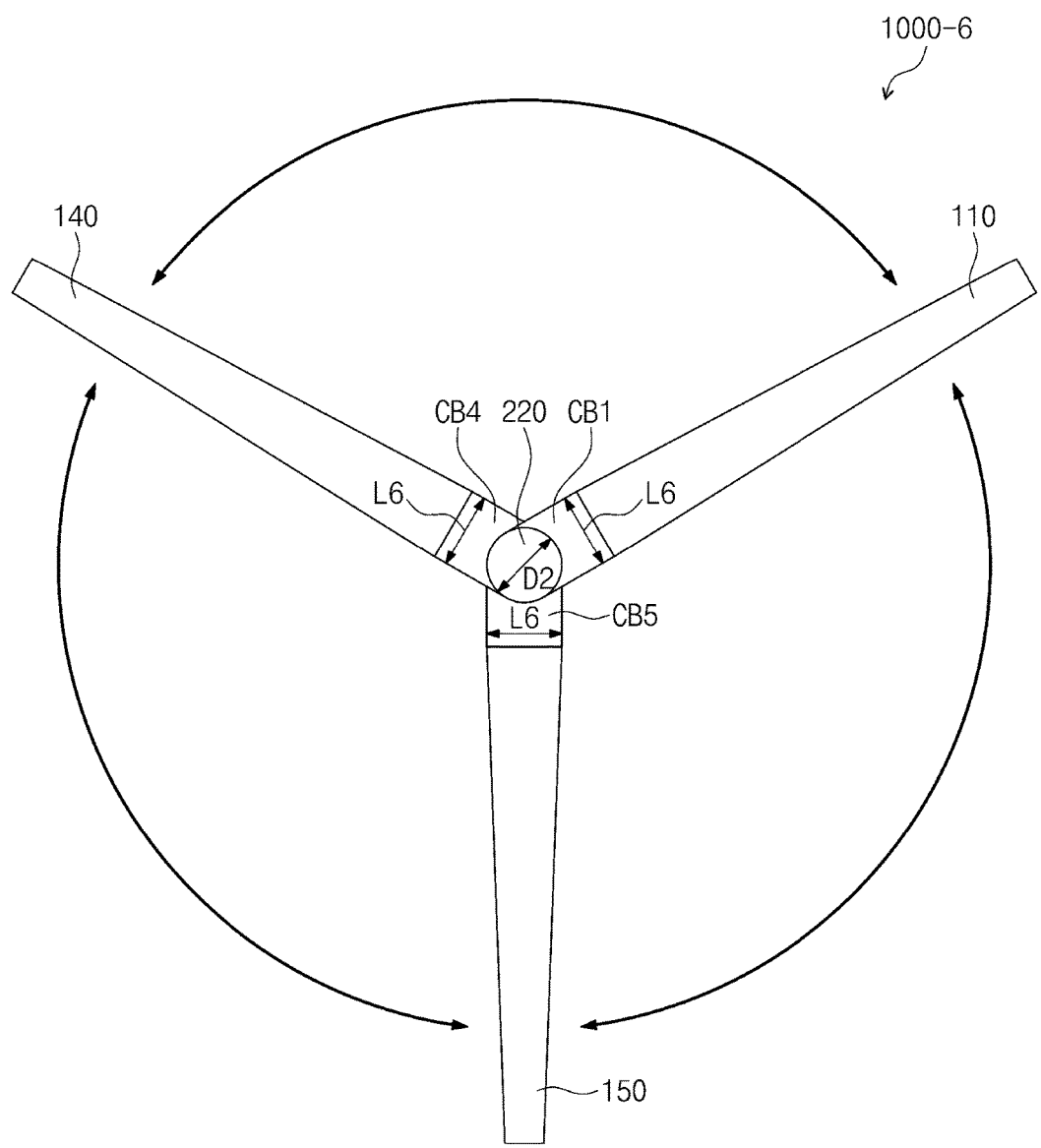
FIG. 12 is a top view illustrating other exemplary embodiments of a display apparatus according to the invention.

FIG. 12 is a top view illustrating a display apparatus according to other exemplary embodiments of the invention. In the exemplary embodiments of FIG. 12, the same elements as in the exemplary embodiments described above will be indicated by the same reference numerals or the same reference designators, and the descriptions thereto will be omitted or mentioned briefly.

Referring to FIG. 12, a display apparatus 1000-6 according to other exemplary embodiments includes a first monitor 110, a fourth monitor 140, and a fifth monitor 150. In addition, a body part 210 according to the illustrated exemplary embodiment includes a first connection part CB1, a first cylinder part (not shown), a fourth connection part CB4, a fourth cylinder part (not shown), a fifth connection part CB5, and a fifth cylinder part (not shown).

The first connection part CB1 is connected to the first cylinder part (not shown), and the fourth connection part CB4 is connected to the fourth cylinder part (not shown). The fifth connection part CB5 is connected to the fifth cylinder part (not shown). The fourth connection part CB4 is disposed under the first connection part CB1, and the fifth connection part CB5 is disposed under the fourth connection part CB4.

The first monitor 110 is connected to the first connection part CB1, and the fourth monitor 140 is connected to the fourth connection part CB4. The fifth monitor 150 is connected to the fifth connection part CB5.

The first monitor 110, the fourth monitor 140, and the fifth monitor 150 may be arranged in the series arrangement type. In other words, the first monitor 110, the fourth monitor 140, and the fifth monitor 150 do not contact each other.

Figure 13:
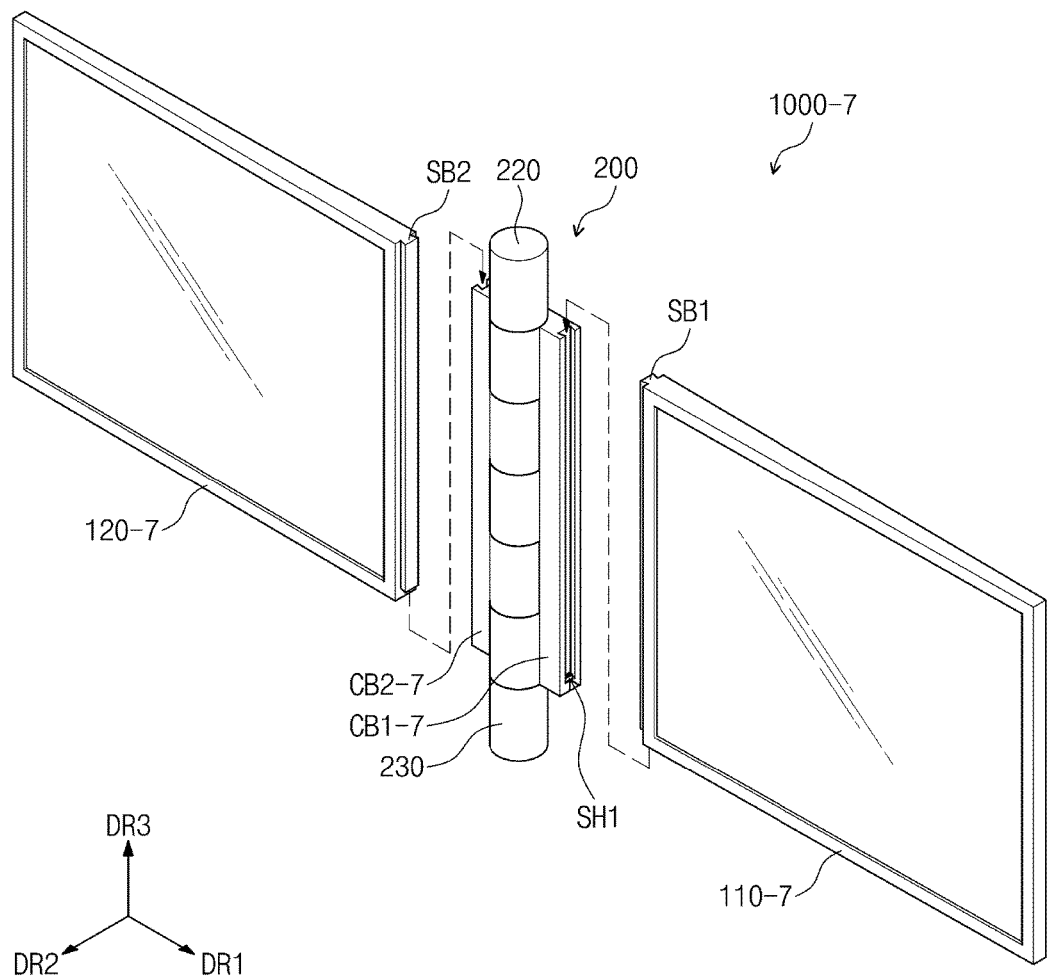
FIG. 13 is an exploded perspective view illustrating other exemplary embodiments of a display apparatus according to the invention.
Figure 14:
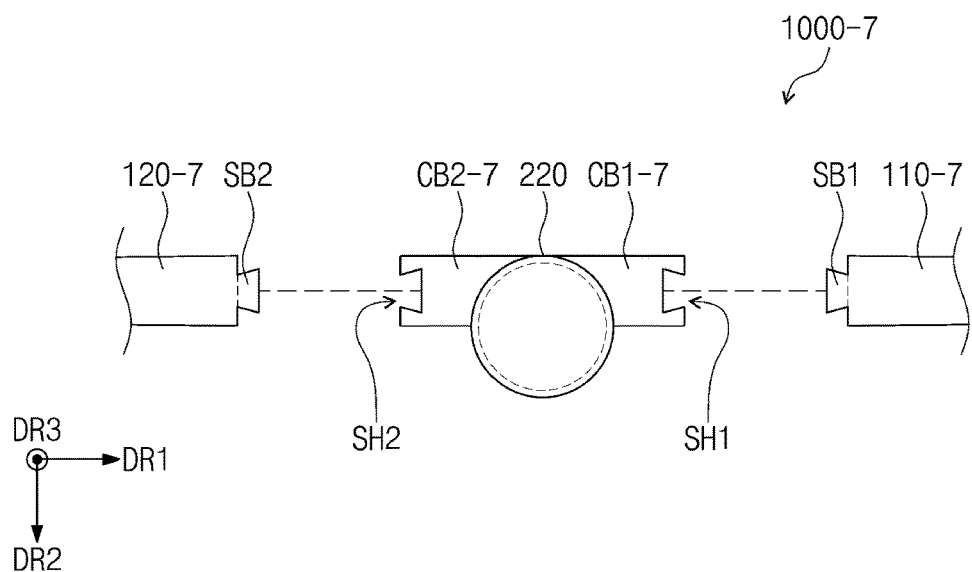
FIG. 14 is a top view of the display apparatus illustrated in FIG. 13.

FIG. 13 is an exploded perspective view illustrating a display apparatus 1000-7 according to other exemplary embodiments of the invention, and FIG. 14 is a top view of the display apparatus 1000-7 illustrated in FIG. 13. In the exemplary embodiments of FIGS. 13 and 14, the same elements as in the exemplary embodiments described above will be indicated by the same reference numerals or the same reference designators, and the descriptions thereto will be omitted or mentioned briefly.

Referring to FIGS. 13 and 14, according to the illustrated exemplary embodiment, a first monitor 110-7 includes a first sliding bar SB1, and a second monitor 120-7 includes a second sliding bar SB2. A first sliding groove SH1 is defined in a first connection part CB1-7, and a second sliding groove SH2 is defined in a second connection part CB2-7.

The first sliding bar SB1 may slide in the third direction DR3 so as to be inserted into the first sliding groove SH1. The second sliding bar SB2 may slide in the third direction DR3 so as to be inserted into the second sliding groove SH2.

In other words, since the first sliding bar SB1 and the second sliding bar SB2 are inserted into the first sliding groove SH1 and the second sliding groove SH2, respectively, the first and second monitors 110-7 and 120-7 may be connected to the first and second connection parts CB1-7 and CB2-7.

Figure 15:
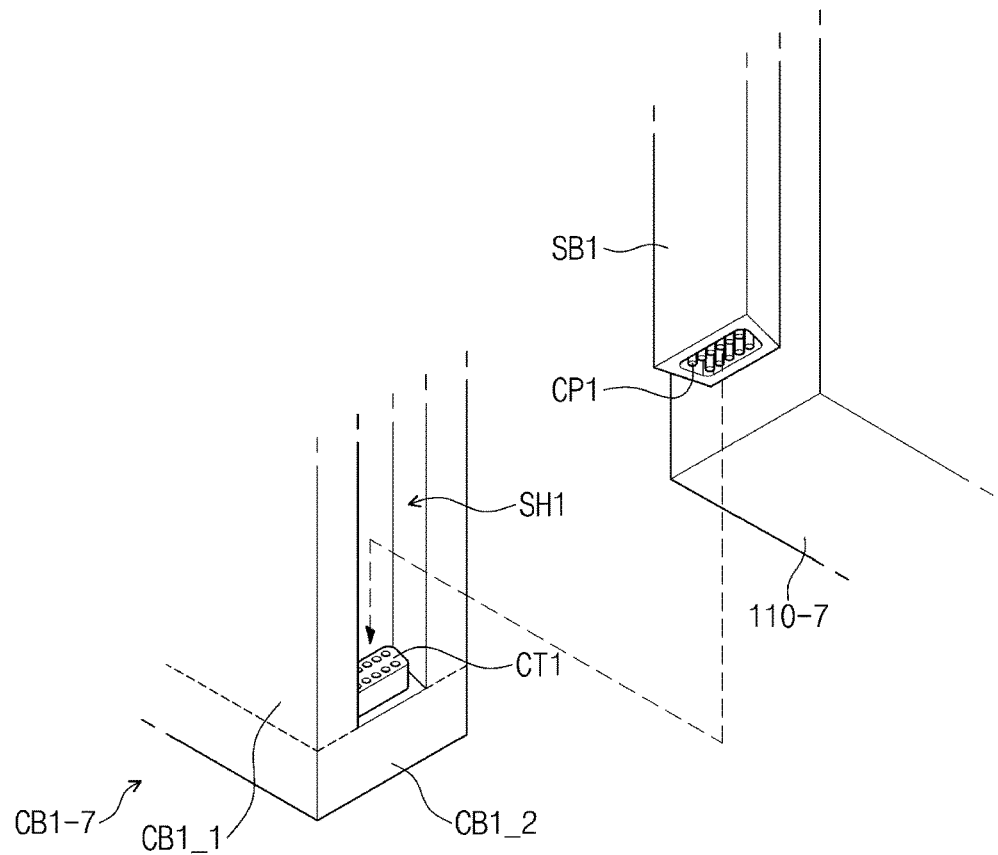
FIG. 15 is an enlarged view of a sliding bar and a sliding groove illustrated in FIG. 13.

FIG. 15 is an enlarged view of the first sliding bar and the first sliding groove illustrated in FIG. 13. The connection relation between the first monitor 110-7 and the first connection part CB1-7 may be the same as the connection relation between the second monitor 120-7 and the second connection part CB2-7, and thus illustration and descriptions of the second monitor 120-7 and the second connection part CB2-7 will be omitted.

Referring to FIG. 15, the first monitor 110-7 according to the illustrated exemplary embodiment may further include a connecting pin CP1 disposed on a bottom surface of the first sliding bar SB1.

The first connection part CB1-7 includes a first portion CB1_1 and a second portion CB1_2 disposed under the first portion CB1_1. The first portion CB1_1 and the second portion CB1_2 are in one body.

The first sliding groove SH1 may be defined in one side surface of the first portion CB1_1. The first sliding groove SH1 is not defined in the second portion CB1_2. The first connection part CB1-7 may further include a first connecting terminal CT1 disposed at an area of a top surface of the second portion CB1_2 exposed through the first sliding groove SH1.

When the first sliding bar SB1 slides along the third direction DR3 so as to be coupled to the first sliding groove SH1, the first connecting pin CP1 may be coupled to the first connecting terminal CT1.

However, the invention is not limited to the arrangement relation between the first connecting terminal CT1 and the first connecting pin CP1. In an exemplary embodiment, FIG. 15 illustrates the first connecting terminal CT1 and the first connecting pin CP1 which are disposed at an inner surface of the first sliding groove SH1 and the bottom surface of the first sliding bar SB1, respectively, for example. However, the invention is not limited thereto. In other exemplary embodiments, the first connecting terminal CT1 and the first connecting pin CP1 may be disposed at the inner surface of the first sliding groove SH1 and a top surface of the first sliding bar SB1.

Figure 16A:
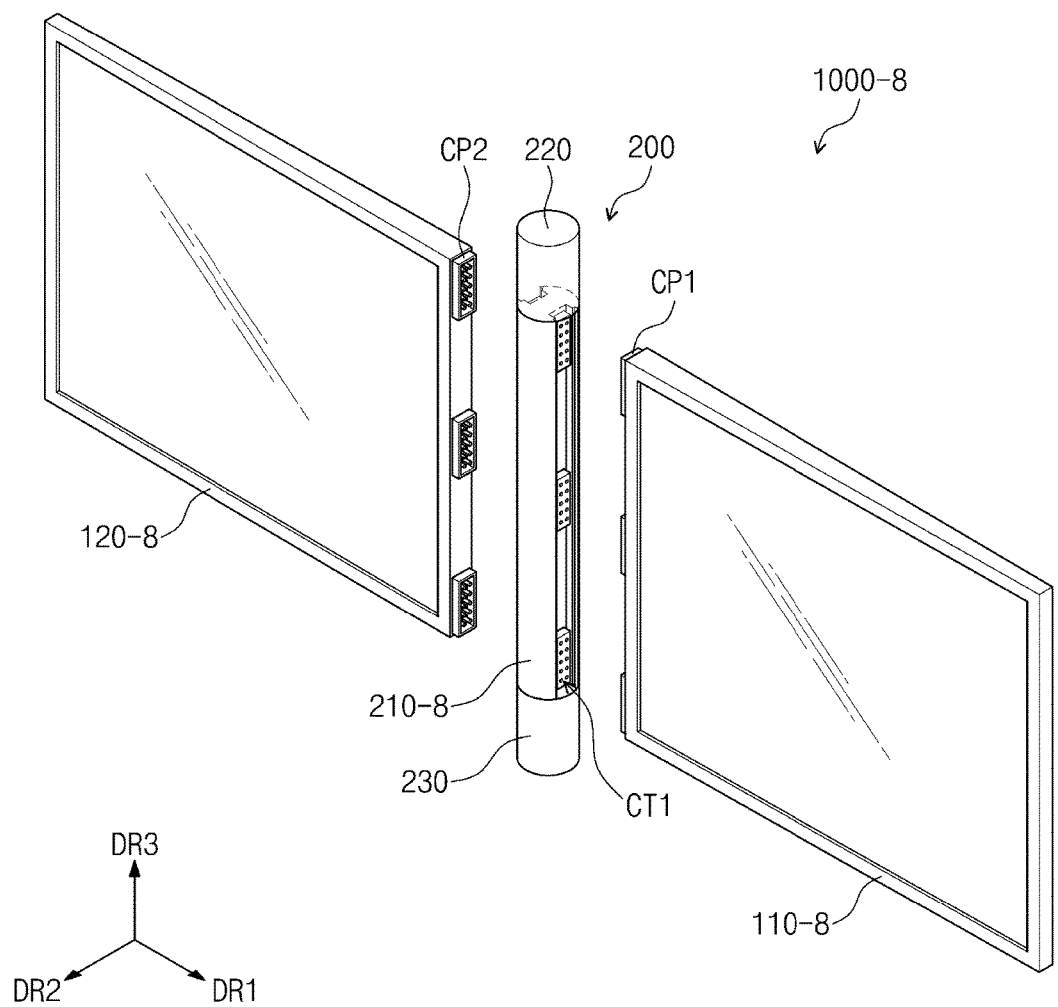
FIG. 16A is an exploded perspective view illustrating other exemplary embodiments of a display apparatus according to the invention.
Figure 16B:
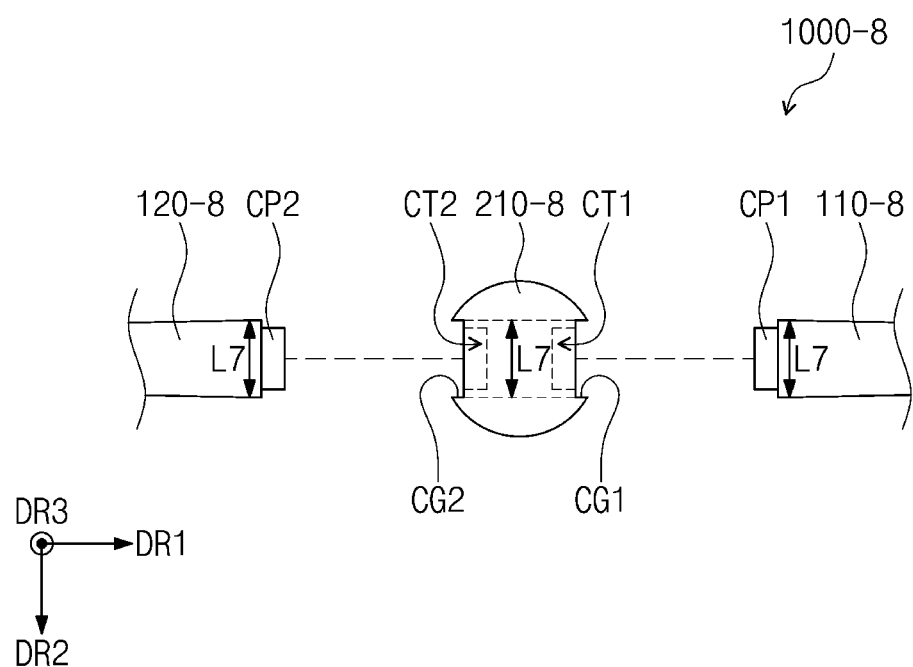
FIG. 16B is a top view of the display apparatus illustrated in FIG. 16A.

FIG. 16A is an exploded perspective view illustrating a display apparatus 1000-8 according to other exemplary embodiments of the invention. FIG. 16B is a top view of the display apparatus illustrated in FIG. 16A. In the exemplary embodiments of FIGS. 16A and 16B, the same elements as in the exemplary embodiments described above will be indicated by the same reference numerals or the same reference designators, and the descriptions thereto will be omitted or mentioned briefly.

Referring to FIGS. 16A and 16B, a body part 210-8 according to the illustrated exemplary embodiment does not rotate. In other words, a first monitor 110-8 and a second monitor 120-8 do not rotate. The body part 210-8 fixes the first monitor 110-8 and the second monitor 120-8.

In more detail, according to the illustrated exemplary embodiment, a first coupling groove CG1 and a second coupling groove CG2 are defined in the body part 210-8. The first coupling groove CG1 receives a portion of one side portion of the first monitor 110-8, and the second coupling groove CG2 receives a portion of one side portion of the second monitor 120-8.

A plurality of first connecting terminals CT1 may be disposed at an inner side surface of the first coupling groove CG1, and a plurality of second connecting terminals CT2 may be disposed at an inner side surface of the second coupling groove CG2. The first connecting terminals CT1 are arranged in the third direction DR3 and are spaced apart from each other in the third direction DR3.

In addition, a plurality of first connecting pins CP1 may be disposed on one side surface of the first monitor 110-8 facing the first coupling groove CG1, and a plurality of second connecting pins CP2 may be disposed on one side surface of the second monitor 120-8 facing the second coupling groove CG2. The first connecting pins CP1 are arranged in the third direction DR3 and are spaced apart from each other in the third direction DR3.

The first connecting pins CP1 may be coupled to the first connecting terminals CT1 and the second connecting pins CP2 may be coupled to the second connecting terminals CT2.

FIG. 16A illustrates the plurality of connecting terminals CT1 and CT2 and the plurality of connecting pins CP1 and CP2. However, exemplary embodiments of the invention are not limited the numbers of the connecting terminals CT1 and CT2 and the connecting pins CP1 and CP2. In other exemplary embodiments, each of the first and second coupling grooves CG1 and CG2 may include one connecting terminal CT1 or CT2, and each of the first and second monitors 110-8 and 120-8 may include one connecting pin CP1 or CP2.

According to the illustrated exemplary embodiment, a width of the first coupling groove CG1 taken along the second direction DR2 may be equal to a width of the one side surface of the first monitor 110-8 facing the first coupling groove CG1. A width of the second coupling groove CG2 may be equal to a width of the one side surface of the second monitor 120-8 facing the second coupling groove CG2.

In the illustrated exemplary embodiment, the width of the first coupling groove CG1 may be equal to the width of the second coupling groove CG2. However, the invention is not limited thereto. In other exemplary embodiments, the width of the first coupling groove CG1 may be different from the width of the second coupling groove CG2.

Figure 17A:
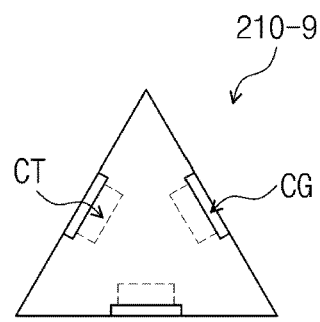
FIG. 17A is a top view illustrating other exemplary embodiments of a body part according to the invention.
Figure 17B:
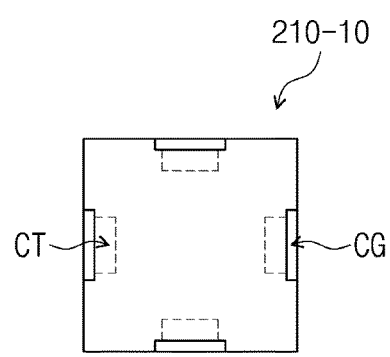
FIG. 17B is a top view illustrating other exemplary embodiments of a body part according to the invention.
Figure 17C:
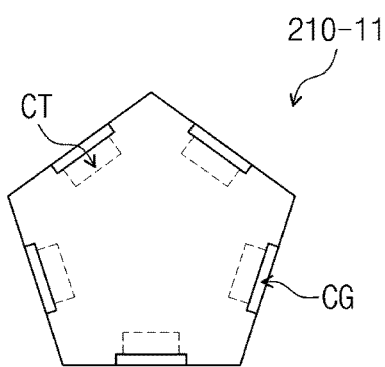
FIG. 17C is a top view illustrating other exemplary embodiments of a body part according to the invention.

FIGS. 17A to 17C are top views illustrating body parts according to other exemplary embodiments of the invention.

Referring to FIGS. 17A to 17C, a shape of a body part 210-9, 210-10, or 210-11 according to other exemplary embodiments may have a polygonal shape on a plane perpendicular to the third direction DR3.

As illustrated in FIG. 17A, the body part 210-9 may have a triangular shape on the plane perpendicular to the third direction DR3. In other words, the body part 210-9 may have a triangular pillar shape. In this case, coupling grooves CG in which a connecting terminal CT is disposed may be defined in side surfaces of the body part 210-9. In an exemplary embodiment, the coupling groove CG may be defined in each of the side surfaces of the body part 210-9, for example.

In an alternative exemplary embodiment, the body part 210-10 may have a quadrilateral shape on the plane perpendicular to the third direction DR3 as illustrated in FIG. 17B, or the body part 210-11 may have a pentagonal shape on the plane perpendicular to the third direction DR3 as illustrated in FIG. 17C.

FIGS. 17A to 17C illustrate the body parts 210-9, 210-10, and 210-11 having the triangular shape, the quadrilateral shape, and the pentagonal shape, for example. However, the invention is not limited to the cross-sectional shape of the body part.

Figure 18:
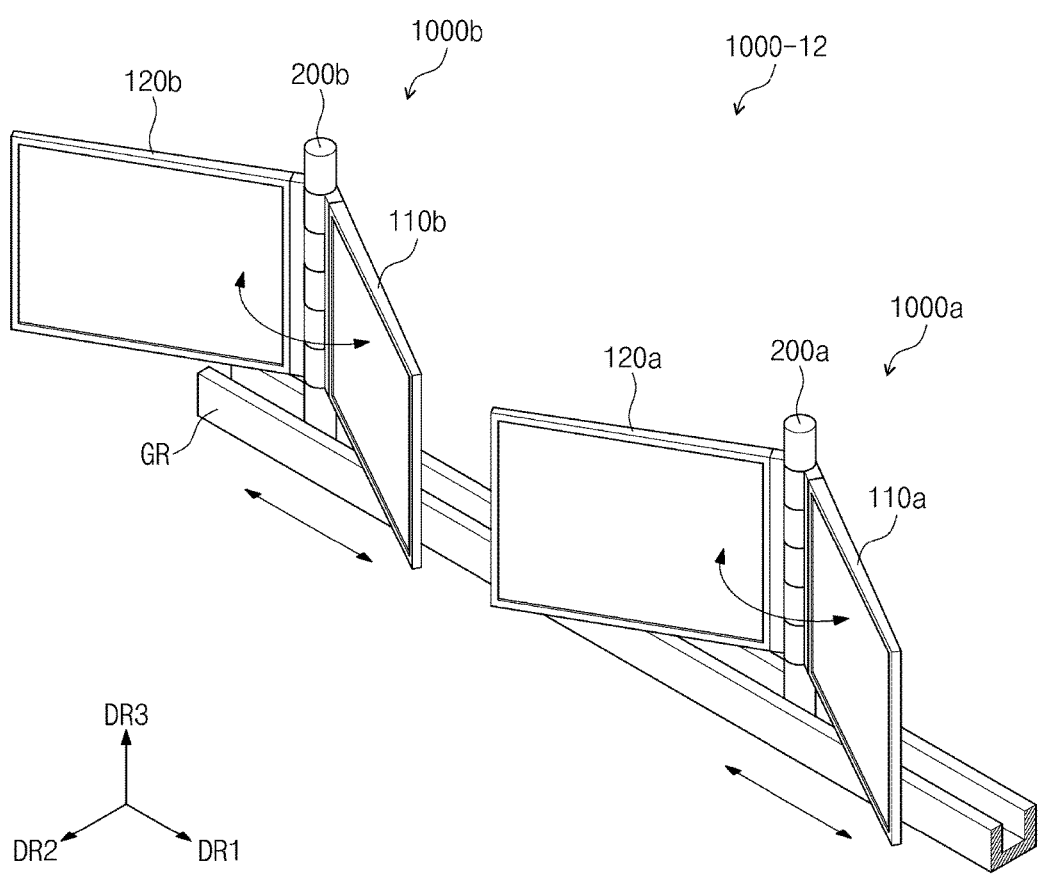
FIG. 18 is a perspective view illustrating other exemplary embodiments of a display apparatus according to the invention.

FIG. 18 is a perspective view illustrating a display apparatus according to other exemplary embodiments of the invention. In the exemplary embodiments of FIG. 18, the same elements as in the exemplary embodiments described above will be indicated by the same reference numerals or the same reference designators, and the descriptions thereto will be omitted or mentioned briefly.

Referring to FIG. 18, a display apparatus 1000-12 according to other exemplary embodiments includes first and second housings 200a and 200b, first to fourth monitors 110a, 120a, 110b, and 120b, and a guide rail GR.

The first and second monitors 110a and 120a of a first display apparatus member 1000a are connected to the first housing 200a. The third and fourth monitors 110b and 120b of a second display apparatus member 1000b are connected to the second housing 200b.

The first housing 200a and the second housing 200b are arranged in the first direction DR1. The second monitor 120a of the first housing 200a may be adjacent to the third monitor 110b of the second housing 200b.

The guide rail GR is disposed under the first housing 200a and the second housing 200b. The first housing 200a and the second housing 200b may reciprocate in the first direction DR1 on the guide rail GR.

FIG. 18 illustrates two housings 200a and 200b and the monitors 110a, 120a, 110b, and 120b corresponding thereto. However, the invention is not limited thereto. In exemplary embodiments, three or more housings may reciprocate in the first direction on the guide rail GR, and monitors may be connected to the three or more housings.

Even though not shown in the drawings, a display apparatus according to other exemplary embodiments may further include a connecting hinge (not shown). The connecting hinge (not shown) may have a pillar shape extending in the third direction DR3. The connecting hinge (not shown) may connect the second monitor 120a to the third monitor 110b. A length of the connecting hinge (not shown) in the third direction DR3 may be equal to a length of one of the second and third monitors 120a and 110b in the third direction DR3.

In this case, the second and third monitors 120a and 110b may be connected to each other by the connecting hinge (not shown), and the first and second housings 200a and 200b may reciprocate along the guide rail GR in the first direction DR1. Thus, the first to fourth monitors 110a, 120a, 110b, and 120b may contact each other or be spaced apart from each other in a bellows shape.

Figure 19:
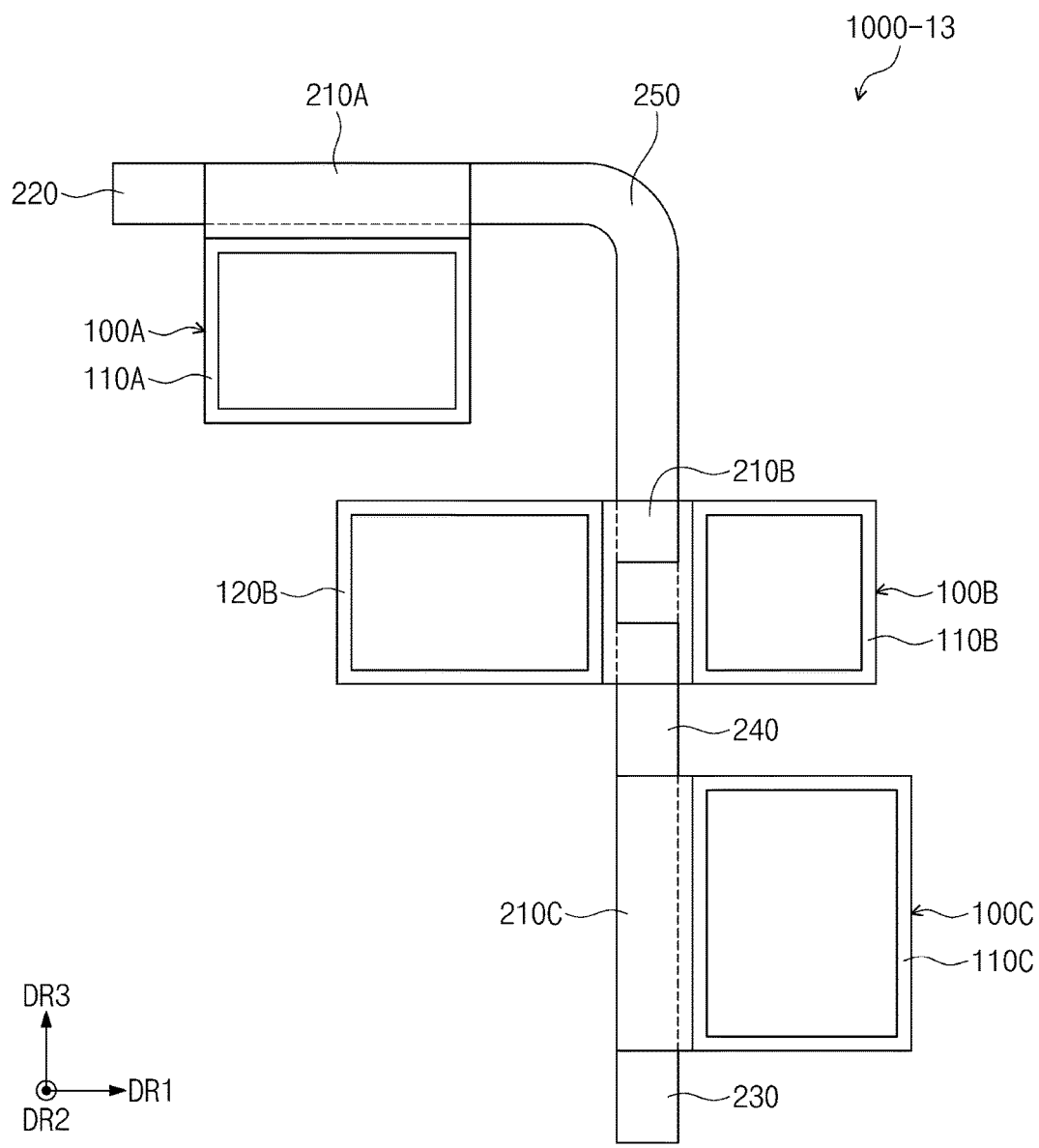
FIG. 19 is a front view illustrating other exemplary embodiments of a display apparatus according to the invention.

FIG. 19 is a front view illustrating a display apparatus according to other exemplary embodiments of the invention. In the exemplary embodiments of FIG. 19, the same elements as in the exemplary embodiments described above will be indicated by the same reference numerals or the same reference designators, and the descriptions thereto will be omitted or mentioned briefly.

Referring to FIG. 19, a display apparatus 1000-13 according to other exemplary embodiments includes a plurality of body parts 210A, 210B, and 210C, a plurality of monitor parts 100A, 100B, and 100C connected to the body parts 210A, 210B, and 210C, a cover part 220, a support part 230, and first and second connecting cylinders 240 and 250.

A first body part 210A extends in the first direction DR1. The first body part 210A is connected to one of side surfaces of a monitor 110A of a first monitor part 100A. The one side surface of the monitor 110A, which is connected to the first body part 210A, extends in the first direction DR1.

A second body part 210B extends in the third direction DR3. A second monitor part 100B connected to the second body part 210B includes a first monitor 110B and a second monitor 120B. A size or shape of the first monitor 110B may be different from a size or shape of the second monitor 120B. In an exemplary embodiment, a front surface and a back surface of the first monitor 110B may have square shapes, and a front surface and a back surface of the second monitor 120B may have rectangular shapes, for example.

The first monitor 110B and the second monitor 120B of the second monitor part 100B may be connected to the second body part 210B in the parallel arrangement type.

A third body part 210C is disposed under the second body part 210B. The third body part 210C extends in the third direction DR3. The third body part 210C is connected to one of side surfaces of a monitor 110C of a third monitor part 100C. The one side surface of the monitor 110C, which is connected to the third body part 210C, extends in the third direction DR3.

The first connecting cylinder 240 may be disposed between the second body part 210B and the third body part 210C. The first connecting cylinder 240 may be the same as that described with reference to FIG. 10, and thus the descriptions thereto will be omitted.

The second connecting cylinder 250 is disposed between the first body part 210A and the second body part 210B. The second connecting cylinder 250 may be connected to the first body part 210A and the second body part 210B to constitute one body. The second connecting cylinder 250 has a bent shape. In more detail, one end of the second connecting cylinder 250 extends in the first direction DR1 so as to be connected to the first body part 210A, and another end of the second connecting cylinder 250 extends in the third direction DR3 so as to be connected to the second body part 210B.

As described above, the shape and design of the display apparatus 1000-13 according to the illustrated exemplary embodiment may be variously changed according to demands of a user.

As a result, according to the aforementioned exemplary embodiments, the durability and convenience of the display apparatus may be improved. In addition, since the driving unit 300 of each of the monitors is received in a single housing, the spatial efficiency of the display apparatus may be improved.

According to exemplary embodiments of the invention, the durability and spatial efficiency of the display apparatus may be improved.

While the invention have been described with reference to exemplary embodiments, it will be apparent to those skilled in the art that various changes and modifications may be made without departing from the spirits and scopes of the invention. Therefore, it should be understood that the above exemplary embodiments are not limiting, but illustrative. Thus, the scopes of the invention are to be determined by the broadest permissible interpretation of the following claims and their equivalents, and shall not be restricted or limited by the foregoing description.

What is claimed is:
1. A display apparatus comprising:
a housing having a pillar shape;
a plurality of monitors, each of which includes a front surface and a back surface through which an image is displayed and side surfaces connecting the front surface and the back surface; and
a driving unit received in the housing, the driving unit providing driving signals to the plurality of monitors, wherein one side surface of the side surfaces of each of the plurality of monitors is coupled to the housing, and wherein a thickness of each of the plurality of monitors decreases as a distance from the housing increases.

2. The display apparatus of claim 1, wherein the housing comprises: a plurality of hinge parts connected to the plurality of monitors in one-to-one correspondence and rotating with reference to a central axis of the housing.

3. The display apparatus of claim 2, wherein each of the plurality of hinge parts comprises:
a cylinder part comprising at least one cylinder unit having a pillar shape; and
a connection part connecting the cylinder part and the one side surface of each of the plurality of monitors.

4. The display apparatus of claim 3, wherein the cylinder parts of the plurality of hinge parts are arranged in a direction parallel to the central axis.

5. The display apparatus of claim 4, wherein one of the at least one cylinder unit of one of the cylinder parts is disposed between two of the cylinder units of another of the cylinder parts.

6. The display apparatus of claim 5, wherein a diameter of the cylinder part is equal to or greater than a sum of widths of the one side surfaces respectively included in the plurality of monitors.

7. The display apparatus of claim 3, wherein the at least one cylinder unit of the cylinder part is provided in plurality, and
wherein the cylinder units are spaced apart from each other in a direction parallel to the central axis and are connected to the connection part.

8. The display apparatus of claim 3, wherein the connection part comprises:
at least one connecting terminal, and
wherein each of the plurality of monitors comprises:
a connecting pin disposed at a side of each of the plurality of monitors and coupled to the at least one connecting terminal in one-to-one correspondence.

9. The display apparatus of claim 8, wherein a sliding groove extending in a direction parallel to the central axis is defined in the connection part,
wherein each of the plurality of monitors comprises a sliding bar protruding from the one side surface of each of the plurality of monitors, and
wherein the sliding bar slides in the direction parallel to the central axis and is coupled to the sliding groove.

10. The display apparatus of claim 9, wherein the at least one connecting terminal is disposed at an inner surface of the sliding groove, and
wherein the connecting pin is disposed on at least one of a top surface and a bottom surface of the sliding bar in the direction parallel to the central axis.

11. The display apparatus of claim 3, wherein the driving unit comprises: at least one main circuit board, and
wherein the at least one main circuit board is received in an inner space of the cylinder part.

12. The display apparatus of claim 3, wherein the driving unit comprises: a plurality of printed circuit boards, and
wherein each of the plurality of printed circuit boards is received in an inner space of the connection part.

13. The display apparatus of claim 3, wherein the housing further comprises:
at least one connecting cylinder disposed between the cylinder parts connected to the plurality of monitors.

14. The display apparatus of claim 13, wherein the at least one connecting cylinder has a bent shape, and
wherein directions of central axes of the cylinder parts connected to both ends of the at least one connecting cylinder are different from each other.

15. The display apparatus of claim 2, wherein the housing further comprises:
a cover part connected to an upper portion of the plurality of hinge parts; and
a support part connected to a lower portion of the plurality of hinge parts.

16. The display apparatus of claim 1, wherein the housing includes at least one coupling groove defined in a side surface of the housing, and
wherein the one side of each of the plurality of monitors is inserted in the coupling groove.

17. The display apparatus of claim 16, wherein a cross section of the housing has a polygonal shape.

18. The display apparatus of claim 1, wherein
the housing is provided in plurality,
wherein the display apparatus further comprises a guide rail disposed under the housings, and
wherein the housings move along the guide rail.

19. The display apparatus of claim 1, wherein at least one of a control button, a speaker, a microphone, and a camera module is disposed at the housing.

20. A display apparatus comprising:
a housing having a pillar shape;
a plurality of monitors, each of which comprises a front surface displaying an image, a back surface opposite to the front surface, and a plurality of side surfaces connecting the front surface and the back surface, one side surface of the plurality of side surfaces coupled to the housing; and
a driving unit received in the housing, the driving unit providing driving signals to the plurality of monitors,
wherein a thickness of each of the plurality of monitors decreases as a distance from the housing increases.

* * * * *